United States Patent [19]

Kuehnle

[11] Patent Number: 5,063,538

[45] Date of Patent: * Nov. 5, 1991

[54] OPTOELECTRONIC SIGNAL RECORDING MEDIUM AND METHOD OF MAKING SAME

[76] Inventor: Manfred R. Kuehnle, Waldesruh Rte. 103A, New London, N.H. 03257

[*] Notice: The portion of the term of this patent subsequent to Aug. 29, 2006 has been disclaimed.

[21] Appl. No.: 400,852

[22] Filed: Aug. 30, 1989

[51] Int. Cl.$^5$ .............................................. G11C 13/00
[52] U.S. Cl. .................... 365/106; 428/689; 428/698; 428/699; 428/700; 428/702; 430/60; 430/84; 354/3; 423/600
[58] Field of Search ............... 430/56; 156/DIG. 96; 365/106; 436/60, 84; 428/704, 699, 700, 698

[56] References Cited

U.S. PATENT DOCUMENTS 4,812,352 4/1989 Debe ........................................ 430/56
4,862,414 8/1989 Kuehnle ............................ 430/84 X

*Primary Examiner*—David Welsh

[57] ABSTRACT

An optoelectronic signal recording and storage medium including a base layer, a conductive layer, a photoconductive layer and storage layer has a coherent crystal morphology throughout, even though the chemical and electrical properties of its layers are by choice dramatically different. The base layer is preferably made of monocrystalline sapphire grown in a manner as to allow the growth of the other layers directly on a surface of the base layer without the need to grind and polish that surface, thereby minimizing internal defects in the medium. The monocrystalline base layer also allows the acceptance of exeptionally uniformly distributed charges over wide areas of the medium, thereby enabling the medium to locally record and store minutely differing optoelectronic signals on a background of minimal noise, thus facilitating low light level electronic or optical recording and long term storage of signals and minimal energy readout of those stored signals. The medium base layer can be thin enough to be flexible and transparent and yet to have great strength to provide a firm foundation for the other medium layers. A method of making the medium is also disclosed.

19 Claims, 7 Drawing Sheets

OPTOELECTRONIC SIGNAL RECORDING MEDIUM AND METHOD OF MAKING SAME

BACKGROUND OF THE INVENTION

This invention relates to the recording of optical signals and particularly to an improved optoelectronic recording medium and a method of making that medium.

The recording of optical signals, particularly in large volume and at a high rate, is usually accomplished either by indirect means or by direct means.

In the indirect mode of recording, the optical signal, e.g., a light wavefront, is received by an array of CCD's or other sensors and converted to electronic signals which, in turn, produce magnetic signals to be recorded on a magnetizable medium such as a magnetic tape or disc.

The direct method of recording, on the other hand, involves a direct interaction between the light signal, after it has been properly focused, shaped and geometrically arranged, and a light sensitive medium for direct storage. In this latter method, the storage medium is usually photographic film or a photoconductive material such as selenium or zinc oxide dispersed in a dielectric binder. The former type of medium is used mostly in photographic cameras, while the photoconductive medium is incorporated into office copiers.

The advantages of indirect recording include the ease of reading and processing the converted signal. That signal, recorded magnetically in serial fashion, is readily compatible with electronic circuits that can manipulate and process the recorded information. Another advantage of the indirect mode of recording is the ease with which the information can be erased either partially or totally. In other words, in an indirect recording system, the optical signals, after having been received and converted to magnetic form, possess the ease of handling which produce the flexibility inherent in magnetic read/write/erase systems. The principle disadvantages of the indirect recording method include signal distortion introduced during signal conversion, the need to switch to a serial information handling format, the relatively low upper limit of the bandwidth of the captured data stream, the relatively poor signal-to-noise ratio of the recording medium and the relatively low packing density of the data stored on the medium, i.e., the large volume of tape or space required to store the original data stream.

The principle advantage of direct optical recording is the ease with which the incoming optical signal stream can be routed to the recording medium. The raw information is captured in analog form and stored in a parallel manner so as to retain the geometric relationships of all of the resolution elements contained in the incoming optical wavefront. However, conventional photographic recording techniques have several disadvantages which seriously limit their applications. These include low efficiency during processing in the conversion of the light signal to an ionic chemical signal on the film, the failure to achieve energy reciprocity at signal durations faster than the microsecond range, the need to process the acquired optical signal chemically in order to fix it to the film and the difficulty in accomodating the acquired signal to match the needs of standard electronic data processing circuitry.

Direct recording using known optoelectronic or photoconductive media does not involve chemical processing. In this respect, then, it is preferable to photography, prompting industry to devote considerable resources to improve this mode of data recordation. The efforts in this regard have led to the development of a variety of direct recording optoelectronic film and plate structures. The ones that show the most promise comprise a photoconductive light modulating section and a dielectric storage section. By exposing the modulating section to a light image, an electrical charge can be impressed on the storage section whose spacial distribution over the area of the storage section is an electrical analog of the original image.

In one medium of this type, described in U.S. Pat. No. 2,825,814 (Walkup), the light modulating section and the storage section are separate structures which are assembled in use. That is, the modulating section comprises a photoconductive layer with a transparent conductive base and the storage section is a dielectric layer with a transparent conductive base. In use, the photoconductive and dielectric layers are placed in contact and a high voltage is applied between the conductive bases of the two sections, while a light image is projected onto the assembly. After a brief period, the light is turned off and the two members are separated leaving the light image stored on the dielectric layer as an electrical charge distribution. The image can then be developed by applying toner to that section. This type of recording medium is disadvantaged in many respects. These include the requirement of a high charging voltage with its attendant danger, the necessity of assembling and dissassembling the modulating and storage sections and the distortions in the image-representing electrical charge on the dielectric layer due to the air gap inevitably present between the assembled sections.

Another type of recording medium which does not involve such assembly and dissassembly of the modulating and storage sections of the medium is described in *Electrostatic Imaging and Recording* by E. C. Hutter et al., Journal of the S.M.P.T.E., Vol. 69, January 1960, pp. 32-35. This medium has a transparent organic plastic base layer, such as polyester film, coated on one side with a layer of photoconductive material which is, in turn, coated with a thin layer of a dielectric material. To record an image on the medium, the dielectric layer is precharged by a corona discharge directed to that layer. Then, the photoconductive layer is exposed to a light image, while an electric field is applied across the dielectric layer. The charge in the dielectric layer decays towards zero with the decay being most rapid where the optical image is brightest and, therefore, the photoconducter resistance the lowest. After a time corresponding to the greatest difference between the potentials in the light and dark areas of the medium, the electric field is turned off and the discharging process stops thereby leaving on the dielectric layer an electrostatic charge image corresponding to the optical image incident on the medium. The stored image may be developed by applying toner to the medium or it may be read from the medium by scanning the dielectric layer with a focused electron beam as is done in a vidicon tube to produce a capacitively modulated electrical signal corresponding to the stored image. While this medium is a unitary structure, a voltage must be applied to the medium prior to exposure in order to precharge the dielectric storage section. This increases the cost and complexity of the associated recording apparatus. Also, the image-representing current signal produced by such scanning has relatively poor quality and low signal-to-noise ratio. Furthermore, that scanning process requires a source of high voltage making that medium impractical for use in a portable self-contained instrument such as a microscope or camera which relies on battery power. The medium has several other disadvantages as well which seriously limit, if not prevent, its practical application. More particularly, it has poor light sensitivity comparable to the slowest silver halide films. Furthermore, it can store the acquired data only for a limited period of time, e.g., a few weeks, because of charge leakage in the dielectric storage layer of the medium. Furthermore, that medium is not physically strong or rugged enough to be practical for long-term information storage. U.S. Pat. No. 3,124,456 (Moore) shows a similar structure that is similarly disadvantaged.

Another type of multi-layer electrostatic storage medium which does not require precharging of the medium is disclosed in U.S. Pat. Nos. 4,155,640 and 4,242,433 to Kuehnle et al. This medium comprises a transparent plastic substrate or base which carries a layer of photoconductive material, there being a conductive layer between the photoconductive layer and the base. Superimposed on the photoconductive layer is a layer of dielectric material and on top of that is another conductive layer completing the sandwich. In operation, a low DC voltage is applied to the sandwich between the two conductive layers while the medium is exposed to a light image through the transparent base. The light image causes the photoconductive layer to modulate the flow of charge carriers so that an electrostatic image is impressed on the dielectric storage layer. Thereafter, the conductive layer adjacent the storage layer is stripped off so that a charge distribution corresponding to the original light image remains on the dielectric layer. The stored image can be developed by toner or read by electron beam scanning. While that medium is a unitary structure, it does require the removal of the electrode layer from the storage section following exposure in order for the image-representing charge to remain on the medium. This strippable conductor necessitates the presence of a conductive fluid or a fusable bonding layer between the conductor and the dielectric layer in order to obtain the necessary intimacy between the electrode and the dielectric. This complicates the manufacture of the recording medium and, in the case of the fusable bonding layer, it requires the presence in the associated camera or recorder of a hot shoe or similar device to melt the bonding layer to permit removal of the conductor. That medium also is characterized by the presence of so-called dark currents in its photoconductive layer which result in charge leakage from the dielectric layer. This makes that medium unacceptable for signal storage over an extended period of time.

Yet another recording medium disclosed in U.S. Pat. No. 3,880,514 (Kuehnle) avoids the requirement of a removable conductor to store an image on the medium. However, this is done by eliminating the dielectric layer from the medium. Accordingly, that film can only store an image for a short time due to charge leakage through its photoconductive layer.

Additional problems affecting all of the prior electrographic recording media of which we are aware, including the phototapes and films specifically discussed above, stem from the fact that the materials in all of those multi-layer structures are selected primarily for their ohmic electrical properties and general commercial availability, with minimal consideration being given as to how the various layers should be integrated into a total overall structure which would achieve unprecedented performance. In fact, the layers in the prior structures are made without attention to the interrelationship and the compatibility of those layers. As a result, there are definite mechanical boundaries between the adjacent layers of the media which are a source of internal electrical noise and inconsistencies. Also, various layers may differ in their degrees of perfection giving rise to poor sensitivity, a high noise level in the stored image and premature loss of that image.

Most critically, the importance of the substrate or base material in influencing dramatically the overall operation of the recording medium has been totally overlooked in the prior media. That is, electrographic tapes and films such as those described above, usually utilize for the base a polyester or other organic plastic material. Made as a thin film or tape, this material is quite strong and flexible; also, it is optically clear, at least initially. However, it is subject to elongation and distortion making it difficult to achieve a good bond or adherence of the light modulating section of the medium to the base. This problem can be alleviated to some extent by including a special bonding layer between the substrate and the medium's modulating section as discussed in U.S. Pat. No. 4,269,919 (Kuehrle). On the other hand, that solution creates additional interfaces and boundaries in the medium which are undesirable, as noted above. It also increases the complexity of the medium and the cost of making it since the formation of each layer in the medium involves a separate sputtering or coating process. Still further, while the plastic substrates of the prior flexible tapes and films may have excellent optical clarity when the medium is new, as soon as the medium is placed into service, its substrate reacts to the incident energy at the ultraviolet end of the light spectrum by losing its optical clarity, making the medium less responsive to low light energy levels. These plastic substrates are not particularly scratch resistant either, so that the substrate surfaces often have scratches which impair the medium in the same way.

All of those prior media discussed above with plastic substrates or other components are disadvantaged also because such organic material invariably suffers outgassing when the medium is placed in a vacuum. Bearing in mind that information should ideally be retrieved from these media by electron beam scanning in a vacuum, it becomes apparent that such outgassing will interact with the electrons in the scanning beam and adversely effect, to the point of commercial impracticality, the image-representing electrical signals produced by the scanning process.

To avoid problems caused by such plastics, it has been proposed to make the medium substrate out of an inorganic material such as metal or glass. However, those materials are quite stiff, opaque or fragile. Even if monocrystalline wafers of silicon or sapphire were used, such as those available from the integrated circuit industry, one would face major problems. This is because in order to make such inorganic structures thin enough to be of use for applicant's purposes in an optoelectronic medium, they must be ground and polished to such an extent that there is an excessive amount of breakage. Furthermore, those wafers that do survive the finishing process have surface defects and abrasions caused by such finishing that degrade the bond with, and initiate defects in, any layer of material that is added to the surface of that structure. These internal defects, in turn, reduce the purity and performance of the resultant film to the point of making it useless and impractical as a recording medium for an optoelectronic camera or recorder.

In general, then, while the prior electrographic recording media and processes may work in principle, they are not satisfactory in practice and have never found commercial use. It should be understood in this connection that a suitable recording medium, for applicant's purposes, must be able to be erased completely and also be used a multiplicity of times without any appreciable loss of its strength, flexibility, optical sensitivity or its data storage capability. To applicant's knowledge, none of the known recording media, including those described in the aboveidentified publications, possess these capabilities and, therefore, none are suitable for the detection and recording of low energy optical signals and for the required long-term storage of equivalent electrical signals which are necessary to obtain the above-stated advantages of both direct and indirect recording.

SUMMARY OF THE INVENTION

Accordingly, it is an object of this invention to provide an improved optoelectronic imaging and recording medium.

Another object of the invention is to provide a medium of this type which possesses superior data acquisition and storage capabilities.

Yet another object is to provide an optoelectronic recording medium which obtains the benefits of both direct and indirect recording.

A further object of the invention is to provide a very sensitive recording medium which is responsive to very low light energy levels or electronic pulses.

Another object of the invention is to provide such a medium which has an exceptionally high signal-to-noise ratio.

It is a further objective to provide an optoelectronic imaging and storage medium which has a very wide spectral response from short wavelength signals below the detectability threshold of the human eye to regions in the long wavelength, infrared end of the spectrum, featuring a substrate which transmits ultraviolet, visable and far-infrared radiation frequencies.

Another object is to provide a medium such as this which does not lose its desirable mechanical, electrical and optical properties through use or over time.

Still another object of the invention is to provide such a medium which can acquire and store optical or electrical signals covering a wide range of intensities.

A further object of the invention is to provide an improved optoelectronic recording medium which can store the acquired data for a long time.

Another object of the invention is to provide such a medium which can be erased and reused repeatedly without losing or altering the desirable characteristics described above.

Another object of the invention is to provide a recording medium of this type which may be made very thin and flexible, yet extremely strong and dimensionally stable so that it can be rolled up repeatedly on a spool without any material degradation of the medium.

A further object is to provide such a medium that does not require any separable electrodes or other parts.

Still another object of the invention is to provide an optoelectronic recording medium for storing optical and electrical signals so that the stored data can be read out conveniently and efficiently by electron beam scanning without destruction of the recorded information.

A further object of the invention is to provide such a medium which permits refreshment of the data stored by the medium.

Yet another object is to provide a method of making a medium having one or more of the above characteristics.

Other objects will, in part, be obvious and will, in part, appear hereinafter. The invention accordingly comprises the sequence of steps and the features of construction, combination of elements and arrangement of parts which will be exemplified in the following detailed description, and the scope of the invention will be indicated in the claims.

Briefly, the recording medium of this invention is a plural layer crystallographically coherent sheet or tape structure which is very thin and flexible, yet strong so that it can be rolled up repeatedly on a spool or reel with substantially no degradation of the structure or the information stored thereon. In contrast to the media that characterize the prior art, the present recording medium possesses a coherent crystal morphology throughout; ideally it is a perfect hetero-epitaxially grown structure. In its preferred form, the medium includes a thin, highly flexible, optically clear, electrically insulating inorganic monocrystalline base or substrate, a very thin, defect free, inorganic monocrystalline light modulating section or modulator which includes a conducting zone for an electrode and a very thin, defect free, inorganic dual material storage layer sandwiched together to form a unitary structure. The modulator is composed of an inorganic photoconductive material that is deposited on a defect free surface of the base using the base material as a "seed". The modulator material is compatible with the base in that it has an atomic lattice that propagates the lattice spacing of the base crystal with a nearly perfect match of atomic distances so that it constitutes a nearly perfect hetero-epitaxially grown layer on the base. Added to the modulator is the dual material storage layer composed of dielectric materials which continue that same compatible crystal morphology and so maintains the atomic continuity and coherence of the medium as a whole.

Thus, while the present medium has the same basic organization as some prior phototapes, i.e., base, photoconductive light modulating layer, and dielectric storage layer arranged in a sandwich, it is a wholly inorganic, coherent, primarily hetero-epitaxially grown crystal structure. While its adjacent layers grow into one another for the depth of a few atoms, it has all of the vastly different electrical and optical properties that such media require.

The medium incorporating my invention has several structural and operational advantages, all of which are interdependent. More particularly, the medium substrate or base is a monocrystal as noted, sapphire being the preferred base material. When made with a high degree of perfection, sapphire is exceptionally strong with a very low coefficient of thermal expansion, in the order of $5(10)-6$ in./in./° C. It is formed directly as a sheet or strip which is thin enough to be very flexible and transparent, yet to be strong enough to provide a very dimensionally stable base for the medium's electrically active layers added to it. Therefore, the base need not undergo grinding or other defect-producing treatment prior to receiving the other material layers comprising the medium. Furthermore, the sapphire base is quite rugged and abrasion resistant, as well as substantially unaffected by light, even at wavelengths at the ultraviolet end of the light spectrum. Accordingly, the base retains its strength, flexibility and optical clarity over a very long period of time. Additionally, being inorganic, the base is not a source of outgassing contaminants when the medium is scanned electronically in a vacuum to read stored data from the medium.

In the present recording medium, the monocrystalline sapphire base not only performs a supporting function as described, it actually establishes the atomic arrangements of the remaining layers of the recording medium so that they all have very high degrees of perfection as well. Rather than there being a distinct, uncontrolled and electrically unpredictable physical boundary or interface between adjacent layers as in ordinary electrostatic recording media attempted before, the adjacent layers of the present medium actually grow into one another. This arrangement provides a bond between the modulator and the base which is very strong and which has substantially no defects, voids, etc. that could be a source of energy conversion losses and electrical noise. Indeed, the modulator in its entirety has few defects, not only because of its extreme thinness, but also because of its being formed by seeding from the base material itself. In other words, the atomic lattice structure of the modulator is quite ordered and defect free by virtue of its having been established by nucleation sites on the defect free surface of the very highly ordered monocrystalline base.

That same coherent morphology is continued into the dual material dielectric storage layer superimposed on the modulator. This optimizes the degree of perfection of the storage layer and the bonding of that layer to the modulator. Accordingly, the storage layer can be very thin so as to support a very intense electric charge field, and yet still suffer minimal charge loss due to leakage through that layer. Thus, it can store an acquired optical or electrical image for a very long period of time, i.e., several years, without degradation of that image. Of special importance is the ability of the defect-free medium to store an image as unusually small, precisely defined charge domains in its storage layer. As we shall see, this gives the stored images exceptionally high resolution and enables the retrieval of those images by counting secondary electrons produced by electron beam scanning of the tape. This scanning process produces electrical picture signals with an equally high information content, while requiring a minimum voltage to power the beam during readout.

In summary, then, the plural layer medium of this invention is a wholly inorganic, crystalline, web-like structure which has exceptionally high sensitivity to light over a very broad spectral range from ultraviolet to infrared. In one preferred embodiment, the medium is a very thin and flexible, yet strong tape. The light sensitivity and spectral response of the medium are comparable to the very best silver halide photographic films. Therefore, it can acquire a useful optical image produced even by very low-intensity light. Further, in having no mechanical boundaries between its various layers and in being substantially defect free, energy conversion losses in the medium are minimal and the medium gives rise to very little internal electronic noise. The optical signal that is acquired by the medium is stored in the dielectric layer of the medium without requiring any chemical processing. Moreover, the medium stores this data in a form that enables the stored image to be read from the medium by electronic scanning even after a prolonged period, i.e., a year or more, as an electrical signal that can be processed or displayed using conventional electronic circuitry. The medium can also be erased and reused repeatedly without appreciable hysteresis loss. Thus, it possesses the desirable characteristics of conventional magnetic recording media such as magnetic tapes and discs. Accordingly, the medium should find wide application wherever the accurate acquisition, longterm storage or display of high quality optical images or electronic patterns is required.

BRIEF DESCRIPTION OF THE DRAWINGS

For a fuller understanding of the nature and objects of the invention, reference should be had to the following detailed description, taken in connection with the accompanying drawings, in which.

DETAILED DESCRIPTION OF THE PREFERRED EMBODIMENTS

Figure 1:
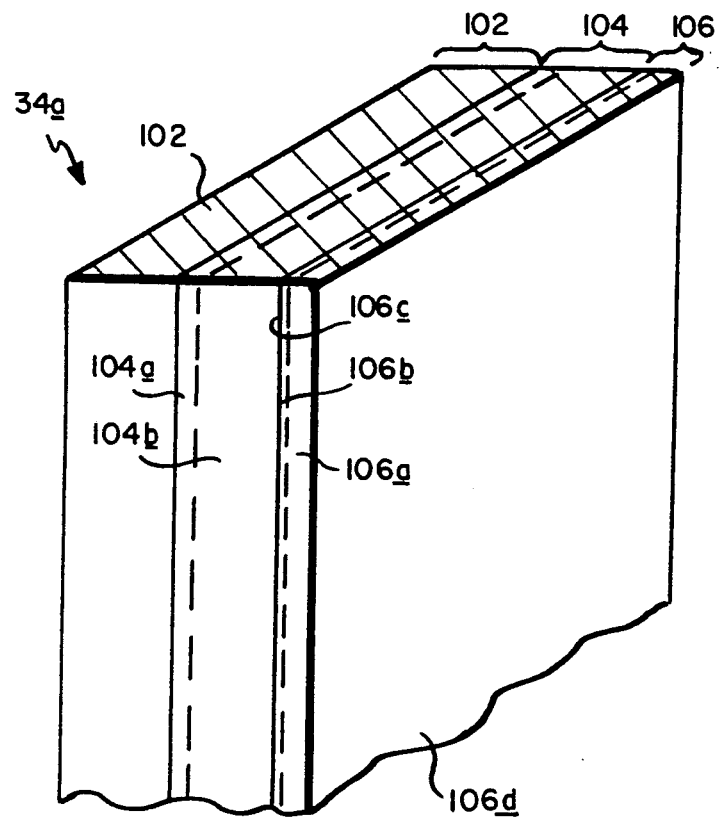
FIG. 1 is a fragmentary diagrammatic view in cross-section of an optoelectronic signal recording medium embodying the principles of this invention.

Referring to FIG. 1 of the drawings, the medium of this invention, indicated generally at 34a, is a thin, flexible, plural-layer, inorganic web structure of indeterminate extent. The thicknesses of its various layers have been exaggerated in FIG. 1 for ease of illustration. Usually the medium takes the form of a long tape or ribbon; but it could be formed as a disk or drum by mounting it to a stiff backing. Also, even though medium 10 is a plural layer structure, it has a coherent crystal morphology. In other words, although the different layers are sharply delineated in FIG. 1, as we shall see, as far as their crystal lattices are concerned, there are no such sharp boundaries or borders in actuality between adjacent layers; rather, they grow into each other at least to the depth of a few atoms.

Medium 10 comprises a substrate or base 102, a light modulator 104 and a dual-material dielectric storage layer all superimposed and grown to form a unitary structure. Thus, although at first glance medium 34a seems to be similar to the phototapes and films described in the above-identified prior publications, particularly Hutter et al, in actuality it represents a radical structural departure from those prior electrostatic recording media and it, therefore, yields hitherto unattainable performance properties. These, in turn, make possible and practical an entirely new type of optoelectronic recording system.

The base 102 of medium 34a is thin, transparent and formed as a single crystal of an inorganic material, preferably sapphire. Although layer 102 is only a few, e.g., 5, microns thick, the rhombohedral structure of its aluminum and oxygen atoms provides exceptionally high cohesive strength without forming easy cleavage planes, unlike glass and other silicon or carbon-based materials which constitute the substrates of some prior rigid electrostatic recording media. As a result, base 102 has exceptionally high mechanical strength and dimensional stability. Also the crystalline arrangement of layer 102 is such that its c-axis is oriented perpendicular to the basal plane of the layer so that the surfaces of that layer are unusually smooth, free of defects and are scratch resistant. Furthermore, being formed as an ultrathin monocrystal, layer 102 is as flexible and spoolable as the plastic substrates used in conventional magnetic tape, yet it is optically clear over a substantially wider wavelength spectrum then are the bases and substrates used in prior recording media of this general type.

Another very important reason for forming base 102 as a sapphire monocrystal is that sapphire has a rhombohedral crystal structure whose lattice is consistent with, and whose atomic spacing more or less matches, those of some photoconductive and dielectric materials that can be used to form the remaining layers of medium 34a. In the medium 34a specifically illustrated herein, the modulator 104 is composed of silicon which has a diamond-cubic crystal arrangement with an atomic spacing that matches closely the oxygen lattice periodicity of the sapphire.

Accordingly, when the different zones or layers comprising modulator 104 are deposited on base 102 by R.F. sputtering or other known means under controlled conditions to be described, the base material functions as a "seed" crystal. That is, it provides nucleation sites for the silicon so that the modulator 104 is added to the base as a monocrystal which propagates the lattice spacing of the sapphire. In other words, the modulator 104 materials are encouraged, if not compelled, to assume an atomic arrangement compatible with the sapphire morphology so that the base and modulator materials actually grow into one another where they meet. Thus, although the modulator 104 is different chemically and electrically from base 102, those parts of the medium share the same atomic lattice at their interface so that there is an unusually strong coherent bond between the two. Also, as noted above, the monocrystalline base 102 is made free of defects. Furthermore, no defectproducing grinding or finishing is involved in the creation of the ultra thin base 102. Therefore, the base receives the added-on layers comprising the medium without introducing defects into these added-on layers. Accordingly, the modulator 104 that is deposited on base 102 is equally devoid of defects that could increase energy conversion losses when an optical image is recorded on the medium or result in the recording of a distorted image.

Still referring to FIG. 1, in order to facilitate the recording of an optical image on the medium, modulator 104 includes a conductive layer or zone 104a adjacent base 102 to provide an electrode at that location. Layer 104a is simply a zone of modulator 104 containing an n-type dopant of phosphorous atoms or the like added to the silicon during the initial deposition of the modulator 104 on base 102. This n-type layer or zone, which is only in the order of 0.2 micron or less thick, has the same coherent atomic lattice structure as the modulator 104 as a whole. The remaining zone 104b of the modulator is devoid of dopants. During the exposure process to be described later, electron-hole pairs are produced in modulator zone 14b by the photons incident on medium 34a. Electrons move to zone 104a and these charges are neutralized in proportion to the absorbed light, while the positive carriers or holes are captured by the storage layer 106.

Dual material storage layer 106 is added to modulator 104 by chemical reaction in a conventional sputtering or coating process so as to have the same coherent crystal morphology as the modulator. In medium 34a, layer 106 is composed of silicon nitride ($Si_3N_4$). Other suitable materials include sapphire ($Al_2O_3$). These inorganic materials have hexagonal crystal structures with atomic spacings which match well the spacing of the silicon atoms in modulator 104. Layer 106, being actually grown from nucleation sites on the smooth surface of modulator 104 is firmly bonded to the modulator and is highly ordered with few internal defects, giving layer 106 great signal storage capability. In other words, even though layer 106 is quite thin, in the order of 0.2 micron, positive and negative charge carriers can reside on opposite sides of that layer with minimal measurable long-term charge loss through that layer. Preferably, storage layer 106 includes a storage zone 106a and an ultrathin (i.e., 10 Angstrom) interfacial zone 106b of a dielectric material adjacent the modulator 104. A suitable such material is silicon dioxide ($SiO_2$). This zone 106b, which is anisotropic, inhibits lateral charge migration or conduction in the plane of layer 106, thereby preventing loss of resolution of the stored image over time. The remaining zone 106a is pure silicon nitride.

The thinness and perfection of storage layer 106 enables an image-representing electric field distribution to be maintained by the medium that is 100 times more intense than that tolerated by prior media, even though medium 10 is in the order of 100 times thinner than those prior structures. During the recording process, the storage layer 106 can accept and store exceptionally uniformly distributed charges over wide areas of the medium in the form of minute charge domains. This enables the medium to locally record and store minutely different optoelectronic signals on a background of minimal noise. Resultantly, optical or electronic signals of very high resolution can be recorded and stored even under poor lighting conditions. By the same token, as we shall see the image-representing charge pattern can be scanned by an electron beam maintained at a relatively low voltage to produce a picture signal that has the same very high information content as the stored image. Its ability to store an electronic pattern across its dielectric extent and to maintain high electric fields across its thickness without dielectric breakdown and/or slow leakage permits medium 34a to store signals for an extended period of time, even in lighted conditions. A typical medium 34a incorporating this invention has the following overall characteristics:

| | |
|---|---|
| Detectability Threshold | 5 electrons (or photons) |
| Quantum Efficiency | 1 (100%) |
| Signal-to-Noise Ratio | 3000:1 (3 sec.) |
| Tensile Strength | up to 40,000 kg/cm$^2$ |
| Modulus of Elasticity | $4 \times 10^6$ |

Figure 3:
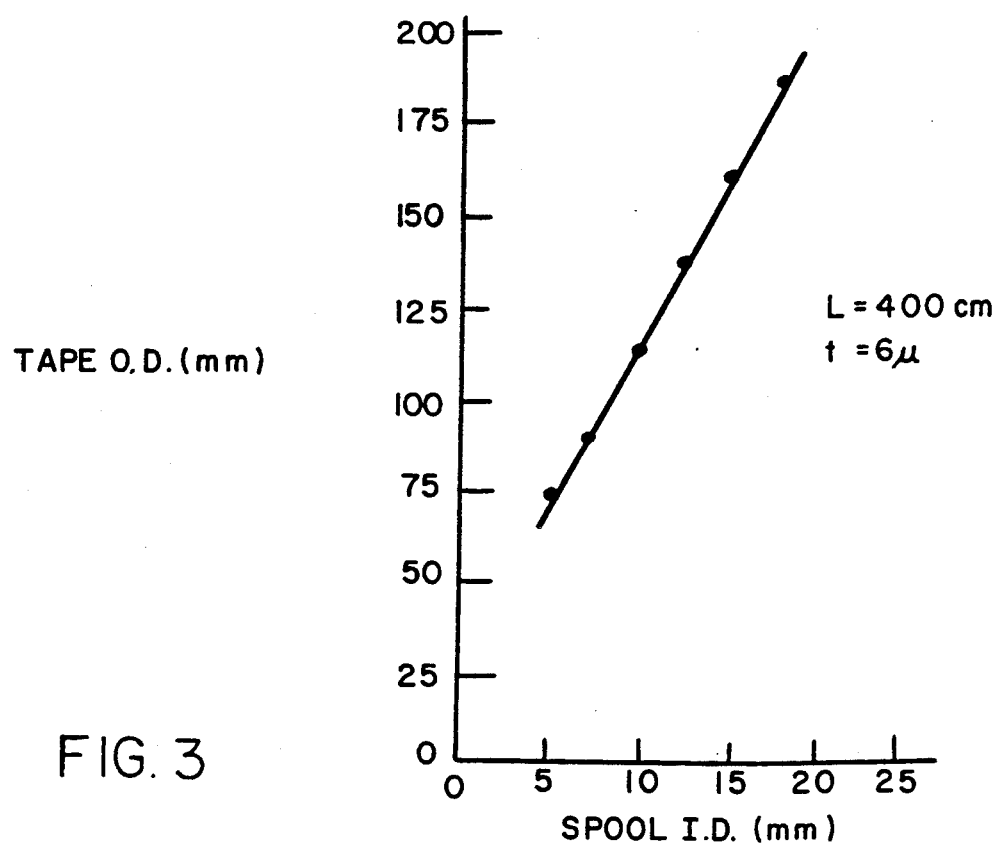
FIG. 3 is a graphical diagram showing the spooling characteristic of the FIG. 1 medium formed as a tape.
Figure 4:
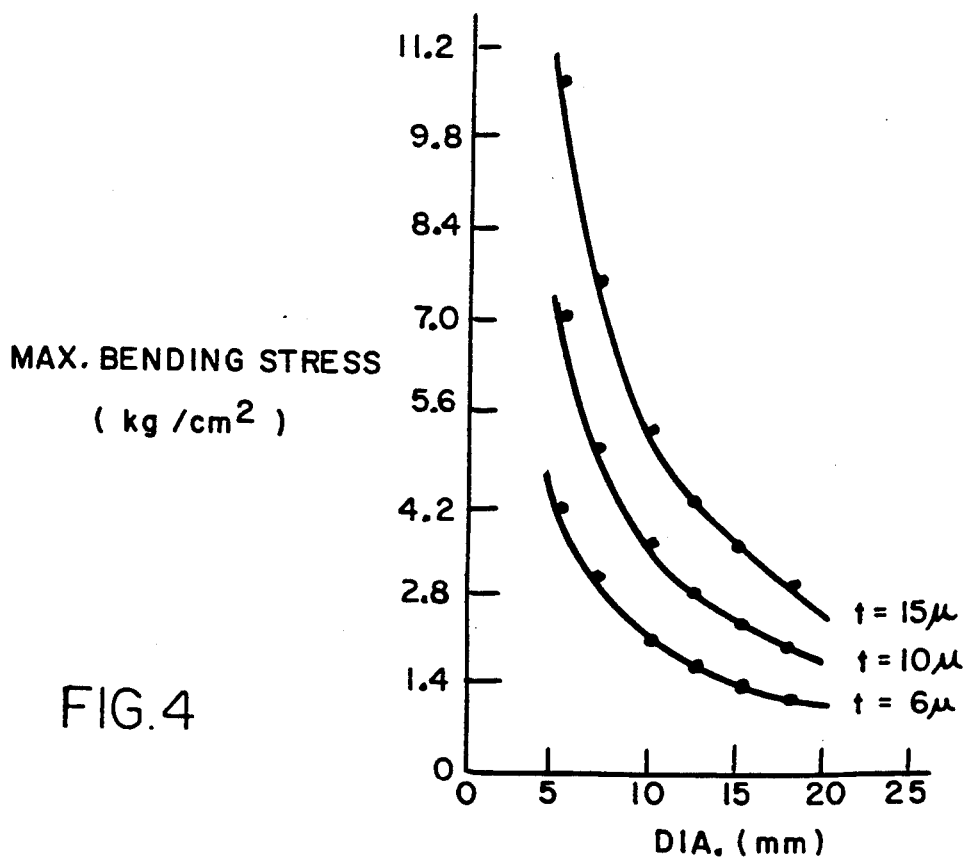
FIG. 4 is a similar diagram showing the bending stress characteristic of such a tape.

Additionally, as shown in FIG. 3, if medium 10 is formed as a tape or ribbon with a thickness of about 6 microns and a length of 400 cm, it will occupy relatively little space when spooled. For example, a coil of tape wound on a 5 mm core would have a diameter of only 7.5 mm. FIG. 4 shows the bending stress on such tapes when spooled. As shown there, the stress on the 6 microns thick tape in the above example is about 4.2 kg/cm$^2$ at the inner end of the tape reducing to only 1.4 kg/cm$^2$ at the outer end of the tape. As seen above, the elasticity and high tensile strength of the medium's sapphire base 102 enables the medium to withstand such stress quite easily.

In the production of medium 34a, base 102 may be formed using a combination of the meniscus techniques used in wet emulsion coating and thin film coating techniques wherein crystals are drawn in edge-fed growing processes from a melt. A principle advantage of growing base 102 in this fashion is the ability to produce the base at an appreciable rate as a relatively wide, ultrathin web having not only an essentially perfect crystal morphology, but also with mirror smooth surfaces which need not be cut, ground, polished or otherwise finished as required with other substrates to their detriment as noted above. Because the resultant web possesses flexibility as a desired virtue due to its thinness, it can be rolled, slit and otherwise processed into the desired form as it emerges from the crystal growing apparatus. Its tensile strength is many times that of steel, while it also can withstand temperatures well above those of steel.

A preferred technique for making a plural layer hetero-epitaxially grown web such as medium 34a is described in detail in Applicant's copending application Ser. No. 172,702 Ser. No. 872,893 of even date herewith, entitled METHOD AND APPARATUS FOR MAKING INORGANIC WEBS AND STRUCTURES FORMED THEREOF, and that disclosure is incorporated herein by reference. That technique will be described briefly at this point with reference to drawing FIG. 2 to complete this description. As shown in that drawing figure, the growing apparatus indicated at 2 includes a molybdenum or iridium vessel 3 containing a melt M of the substrate 102 material, namely sapphire (Al$_2$O$_3$), which is maintained at a temperature in excess of 2000° C. The surface of this melt M is caused to touch a smoothly polished molybdenum or iridium drum 4 which revolves above the melt bath at a spacing which allows merely a meniscus connection 5 between the surface of the melt and the wettable drum surface 4a. The geometry of the neck 5 provides the mechanism for controlling the thickness of the melt that will be deposited on the drum's surface 4a as the drum is rotated in a clockwise direction.

Crystal growth is established on the drum by initially dipping the drum 4 into the melt M and then withdrawing the drum until only the thin neck 5 connects the drum surface to the melt. As the drum rotates clockwise, it draws liquid from the vessel 3, thus progressively coating the drum surface 4a with melt material M which spreads as a thin film or coating 102a of uniform thickness to the ends of the drum. The thinness of neck 5 determines the thickness of the liquid film 102a applied to the drum surface. That, in turn, is dependent upon the viscosity and density of the melt, the wettability of the drum surface 4a measured by the angle of contact between neck 5 and that surface, the spacing of the melt M surface and the drum and, finally, the drum surface velocity.

The liquid film 102a deposited on the drum surface 4a revolves with that surface, being cooled by cooling coils 6. When its leading edge arrives at a chilling station 7, that leading edge makes contact with the cold edge of a sapphire monocrystal seeding bar 8 whose internal crystal orientation represents the crystal structure desired for base layer 102. That cold contact solidifies the film 102a and as the film solidifies, it propagates the arrangement of atoms found at the edge of the seeding bar 8. As described in the above application, the interaction of events at the station 7 demands close control over the thermal gradients in the progression of the solidification of the liquid film both towards the drum surface 4a, as well as in the circumferential direction around the drum. As the film starts to solidify, with its undersurface still liquid, it is peeled from the drum surface 4a at a stripping station 9 as a single crystal sapphire web 102.

That web which will constitute the base 102 of medium 34a is conducted into a heated oven 11 maintained in the same environment as apparatus 2. As the sapphire base 102 traverses a first section 11a of the oven, it is maintained at a temperature in the order of 1,000° C. or less. Also, that web is exposed to a gas stream from a gas source 13a. This gas, typically SiH$_2$Cl$_2$, doped with phosphorous atoms decomposes at that temperature and, in a sputtering process, builds a layer 104a of n-doped silicon on layer 102 from nucleation sites on layer 102, the silicon assuming the atomic arrangement described above. The web now consisting of layer 102 and zone 104a passes into oven section 11b which recieves, via a pipe 13b, the same basic gas without any additive or dopant to form a photoconductive silicon zone 104b which completes the medium's modulator 104.

From oven section 11c, the moving web passes into a third oven section 11a which receives, via pipe 13c, a mixture of SiH$_4$+NH$_3$ and oxygen gasses. In this oven section, the web is maintained at a temperature in the order of 800° C. or less which causes the disassociation of that gas mixture. That, in turn, brings about the growth on interfacial zone 14b of a crystalline silicon dioxide zone 106b. Finally, the web proceeds through oven section 11d into which the same gas without oxygen issues through a pipe 13d. This deposits a crystalline silicon nitride zone 106a on the web which completes the medium's storage layer 106. While zone 106a grows in thickness, it is subjected to simultaneous bombardment from an electron beam source 15 in oven section 11*d* which optimizes the degree of perfection of layer 106*a* by minimizing crystallattice defects in the growth process. The web emerges from oven section 11*d* and is cooled, thereby completing the formation of medium 34*a*. After cooling, the completed web 10 can be slit or otherwise cut to tape or sheet form as desired.

The medium 34*a* described herein and made as aforesaid avoids the disadvantages that characterize prior multi-layer electrographic films and phototapes by incorporating a coherent crystal morphology throughout the medium through repetition of similar atomic distances in all of its layers beginning with the monocrystalline base 102 to create a unitary hetero-epitaxially grown structure. Being of exceptional purity and optical clarity and having no sharp internal mechanical boundaries between layers, the medium operates on a much higher performance plane with respect to its light sensitivity and and spectral response than prior media of this general type.

This medium represents not simply an improvement over previous structures, but rather it establishes an utterly new class of supersensitive materials for optoelectronic signal recording which are capable of acquiring and storing optical data at sensitivity levels and at densities previously unattainable.

Indeed, the fact that the properties and performance of the present medium are so superior to the prior films discussed above has made possible the development of an entirely new type of read/write system or camera designed around this medium.

Figure 5:
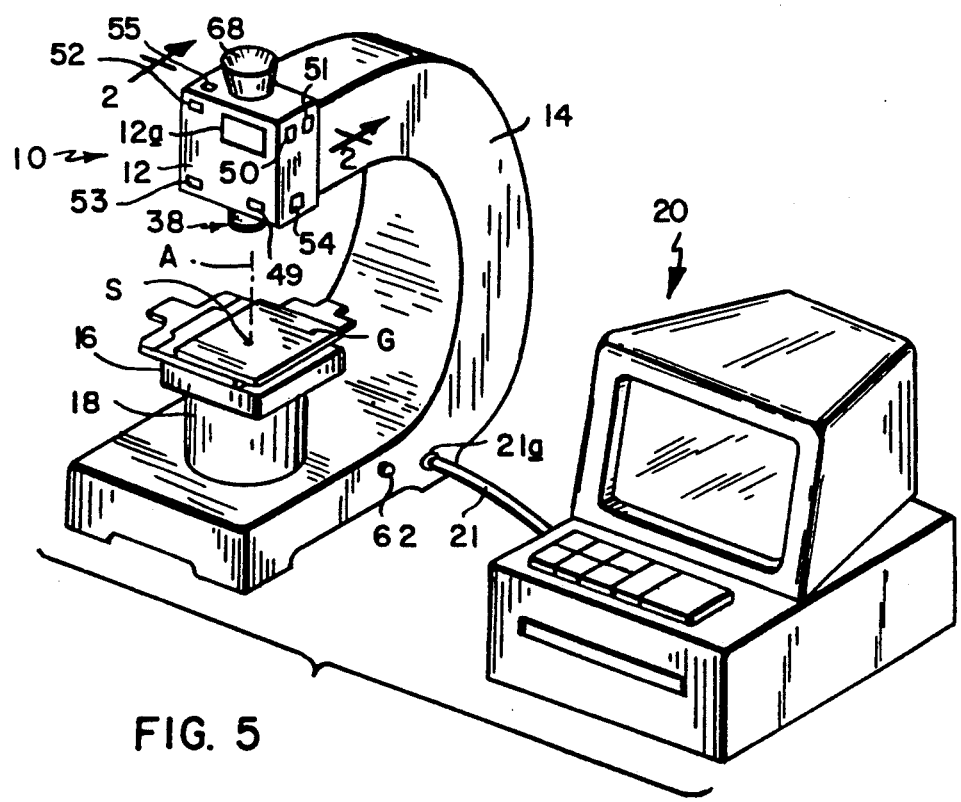
FIG. 5 is an isometric view of an interactive electronic image recording system embodying the invention implemented as a microscope.
Figure 6:
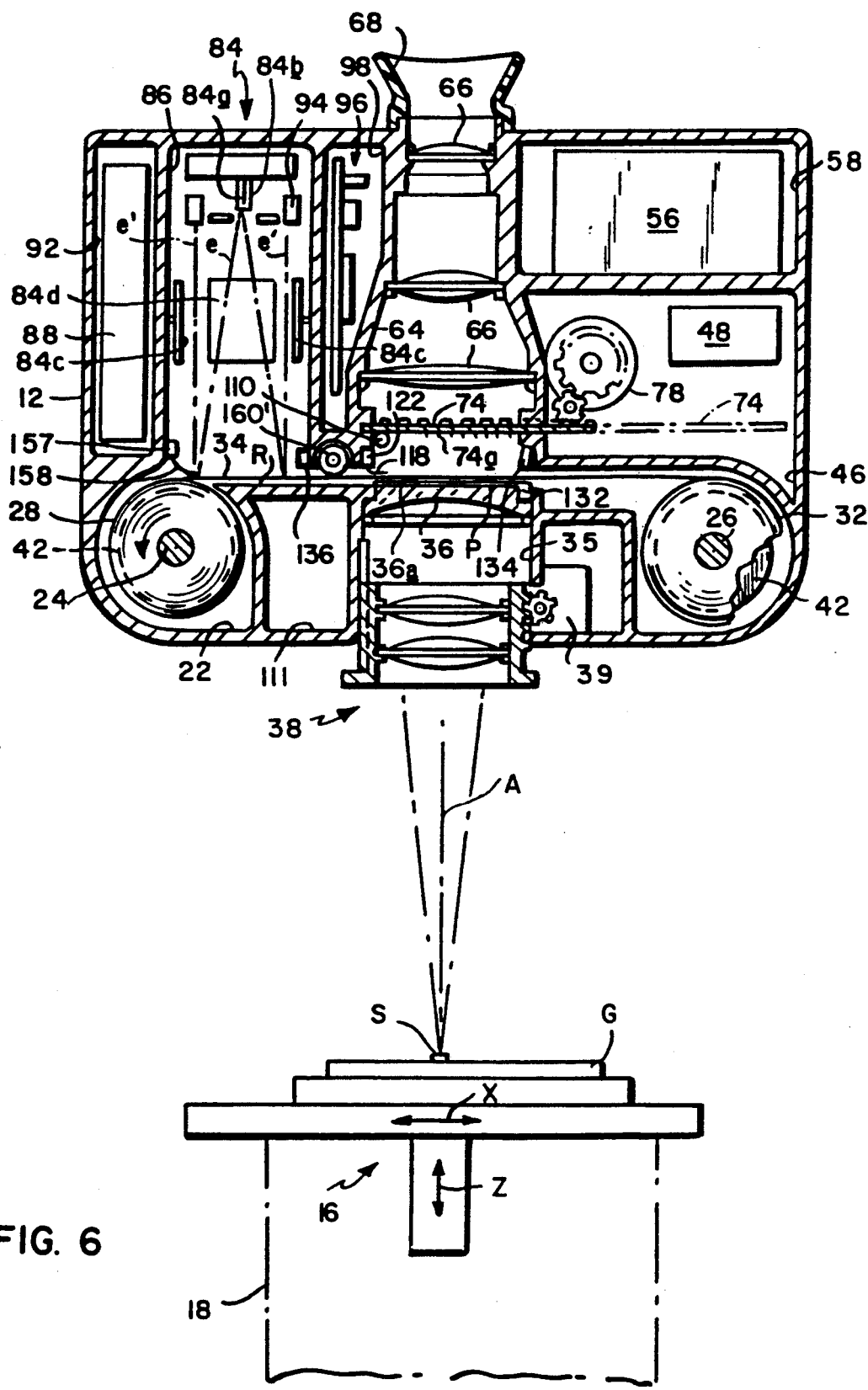
FIG. 6 is a sectional view on a larger scale taken along line 6—6 of FIG. 5.

FIGS. 5 and 6 show such a system which, for purposes of this description, takes the form of a microscopecamera 10 capable of acquiring and storing electronic images of very small specimens or objects. However, the invention could just as well be implemented as a different type of recorder, such as a camera, by substituting the appropriate camera optics or lens system.

The microscope 10 comprises a rigid housing 12 which is supported by a stand 14 above a standard X-Y-Z slide table or positioner 16 mounted to a pedestal 18 projecting up from the base of the stand. The positioner 16 is arranged to support and position a glass slide G on which the specimen S to be viewed is placed. Using the positioner 16, the specimen S can be spotted on the viewing axis A of the microscope 10. After microscope-camera 12 takes a picture of specimen S, which is stored on an optoelectronic recording medium 34 (FIG. 6) inside the microscope, that apparatus can be operated in a readout mode to retrieve the stored image for display or reproduction using a CRT/printer unit indicated generally at 20 connected electrically to the microscope by a cable 21.

As best seen in FIG. 6, the microscope housing 12 is divided into a plurality of internal compartments. More particularly, there is a tape transport compartment 22 at the bottom of the housing which contains a pair of rotary spindles 24 and 26 for supporting take-up and let-off spools or reels 28 and 32, respectively, between which stretches the optoelectronic recording medium which is in the form of a long phototape 34. When the spindles 24 and 26 are rotated, the tape is advanced along a focal plane indicated generally at P which constitues the exposure position of the tape.

The bottom wall of housing 12 is formed with a generally cylindrical cavity 35 which intercepts compartment 22 directly opposite plane P. The inner end of that cavity is closed by a transparent glass platen 36 that isolates compartment 22 from cavity 35. While in FIG. 2 the platen 36 is shown separated from the tape, in actuality, its surface 36*a* positions the tape at focal plane P. The platen may also constitute an optical element in the microscope's optical path to produce field flattening, color correction, filtering, etc. of the incoming optical image. Furthermore, as we shall see, the platen has special light sensing capabilities that are used to focus the microscope automatically prior to taking a picture and to set the exposure duration when the picture is being taken.

The camera's movable lens unit, indicated generally at 38, is rotatively mounted in cavity 35 and the microscope is focused onto specimens by controlling a servomotor 39 that moves the lens unit axially very precisely in one direction or the other. Of course, the instrument can also be focused manually by appropriately moving unit 38.

The tape 34 is moved back and forth between the two spools 28 and 32 by reversible servomotors 42 which rotate spindles 24 and 26 respectively. By applying currents to these motors 42 of the appropriate polarities, the tape 34 may be kept taut and moved in either direction to position a selected tape frame on platen 36 at the microscope's focal plane P. In some applications, the tape may be advanced by other means such as a capstan or a linear or eddy current motor using a metallized margin of the tape itself.

The mechanism for transporting tape 34 may include other components, such as tape edge guides and a tape gate for actually locating each increment or frame of the tape at an exposure position in the image plane P. However, for ease of illustration these components, which are found in many conventional automatic cameras, have not been shown in the drawing figures.

Microscope 10 includes another compartment 46 which contains the camera's control section 48. That section includes a microprocessor and current drivers for providing the drive signals for the drive motors 42 and for the camera's gate (if present). The makeup of section 48 and the programming of its processor will be obvious from the control functions to be described. When the operator pushes a recessed FORWARD button 50 (FIG. 1) in the side wall of housing 12, the control section 48 will apply a selected number of pulses to motors 42 to shift the next tape increment or frame into the exposure position at the image plane P. Signals from control section 48 to the motors will shift the tape frame by frame in the opposite direction when a recessed REVERSE button 51 on the side of the housing 12 is depressed. Preferably, buttons 50 and 51 and the camera's other control buttons to be described are capacitive "touch" buttons built right into the wall of housing 12. These other control buttons include a FOCUS button 49 which may be depressed to automatically focus instrument 10, an EXPOSE button 52 which initiates the recording of an optical signal on the tape 34, a READ button 53 which initiates a read operation on the tape to produce picture signals corresponding to an image stored on the tape and an ERASE button 54 which is depressed to erase an image already stored on the tape in microscope-camera 10. Also, a tape frame counter 55 is mounted in the top wall of housing 12.

The power for motors 42 and for control section 48 and the other electromechanical parts of the apparatus derives from a power supply 56, including batteries, contained in a compartment 58 of housing 12 located above compartment 46. Appropriate electrical conductors are provided between these parts as wires or printed circuits inside the housing. Access to the interior of the battery compartment 58 is had by removing a small cover 12a (FIG. 5) in the front wall of housing 12. Preferably also, the batteries in the power supply 56 are of the type that can be recharged by connecting them to a source of DC power by means of a female connector 62 located at the bottom of stand 14 as shown in FIG. 5.

Housing 12 also has a large compartment 64 which is aligned with the axis of lens unit 38, which axis coincides with the optical axis A of the microscope. Compartment 64 contains the various stationary lenses 66 that comprise the microscope. These are all centered on axis A and the operator uses the microscope to observe specimen S by looking through an eyepiece 68 in the top wall of housing 12.

Referring now to FIG. 6, microscope-camera 10 also includes a field emission device or electron source 74 which is slidably mounted in the housing just above platen 36. The source can be moved between an extended position shown in solid lines in that figure wherein it overlies the tape frame at the focal plane P and a retracted position shown in dotted lines in that same figure in which the gun is located in housing compartment 46 away from the tape. While source 74 may be shifted between its two positions by any suitable means, in the illustrated apparatus, it is moved by a servomotor 78 located in compartment 46 and coupled to source 74 by way of a rack and pinion arrangement. The electron source 74 is normally located in its retracted position so that it does not obstruct the operator's view through the microscope. However, during the exposure process, the source is moved to its extended position overlying the tape by motor 78 under the control of section 48. Section 48 then causes source 74 to direct a cloud of electrons from discharge points 74a of source 74 against the upper side of the tape frame present at the focal plane P. As we shall see, the upper surface of the tape frame at plane P becomes charged with these negative carriers, enabling that frame to acquire and store an electronic image corresponding to the optical image projected onto that frame by the instrument's lens unit 38. The amount of the charge is controlled in terms of time and magnitude to assure the capture of the maximum amount of information contained in the image to be recorded. As we shall see, the electron source 74 is also used to eliminate the electrical bias field from each tape frame after the exposure of that frame by removing excess charge carriers from the frame.

Microscope-camera 10 also includes an electron gun 84 located in a large housing compartment 86 to the left of compartment 64 and used when instrument 10 is operated in its read-out mode. Unlike source 74, electron gun 84 directs a finely focused beam of electrons to the exposed tape frame present at a read plane or position R in compartment 86 that is defined by the bottom wall of that compartment. Gun 84 is controlled so that the electron beam sweeps out a raster on the upper surface of that frame by a circuit 88 located in a housing compartment 92 positioned just to the left of compartment 86. Since tape 34 is temperature dependent, preferably the gun is a cold cathode device that does not generate heat.

During read-out, the scanning electron beam from gun 84 causes secondary electrons to be emitted from the tape frame being scanned whose numerical distribution by area elements (pixels) represents the electronic image stored on that frame. These secondary electrons are collected by an annular electron collector 94 located near the top of compartment 86 which thereupon produces a signal which is the electrical analog of the stored image. That signal is applied to a read-out circuit 96 contained in a housing compartment 98 to the right of compartment 86 where it is amplified, digitized and otherwise conditioned before being applied to the various conductors of the connector 21a to which cable 21 is coupled as shown in FIG. 1. Those picture signals are then fed by way of that cable to terminal 20 where the retrieved image can be viewed or reproduced.

In the microscope-camera 10 specifically illustrated herein, the same tape 34 is intended to remain permanently in the housing compartment 22. Accordingly, that compartment, along with compartments 46, 86 and the portion of compartment 64 below the lowest lens 66, is maintained under a high vacuum, in the order of $10^{-8}$ Torr. To hold the vacuum, airtight seals (not shown) are provided between platen 36 and the wall of cavity 35 and between the lowest lens 66 and the wall of compartment 64. These compartments are thus free of dust, moisture and other contaminants that could interfere with the electrons from the electron sources 74 and 84.

Figure 7:
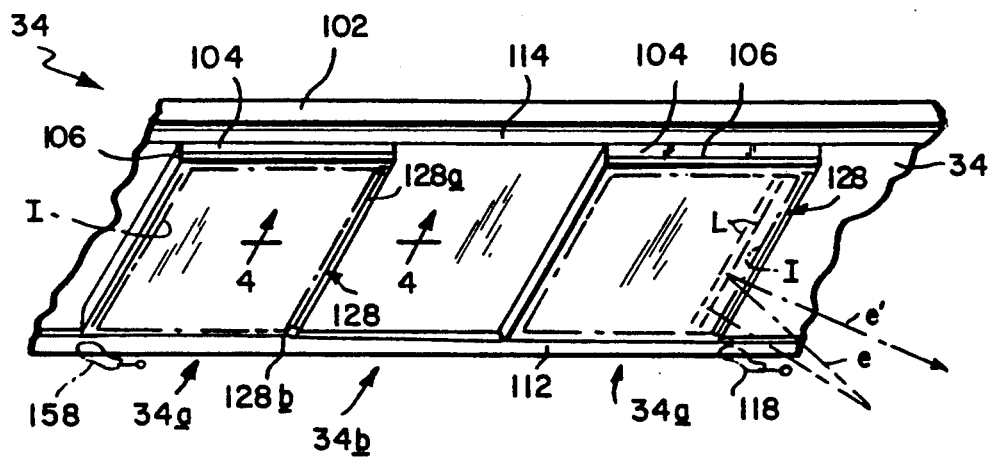
FIG. 7 is a fragmentary isometric view on a still larger scale showing the recording medium or tape used in the FIG. 5 system.
Figure 8:
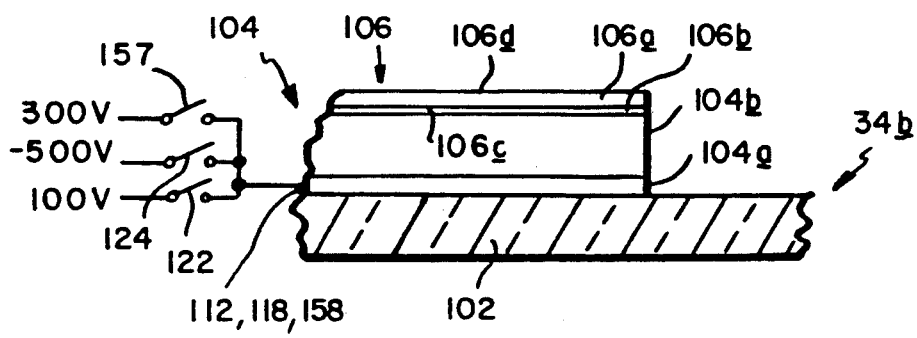
FIG. 8 is a sectional view on an even larger scale taken along line 8—8 of FIG. 7.

Refer now to FIGS. 7 and 8 which show the optoelectronic tape 34 in greater detail. It is composed of a large number of imaging segments or frames 34a and an equal number of viewing segments or frames 34b which alternate along the length of the tape. The tape is made in toto of inorganic materials, as opposed to organic plastic materials. Therefore, it does not produce dreaded contamination caused by outgassing in the high vacuum environment of the microscope and it will, therefore, not produce any adverse effects on the electrons emmitted from guns 74 and 84.

Basically, the tape is a unitary hetero-epitaxially grown structure comprising a flexible, optically clear (from 0.2 to 5.0 micrometers) ribbon-like monocrystalline sapphire ($Al_2O_3$) base or substrate 102. Added to base 102 in each imaging area 34a of the strip are a thin (i.e., about 10,000 Å) modulator 104 composed of a photoconductive material, such as silicon (Si) or gallium arsenide (GaAs), and a very thin (i.e., 1,000 Å) dualmaterial storage layer 106. A very thin phosphorus-doped zone 104a of modulator 104 (i.e., n-doped with fixed positive charges) is present adjacent base 102 to serve as an electrode. The remaining zone 104b of modulator 104 is free of additives.

The dual-material storage layer 106 is composed of a very thin (i.e., about 1,000 Å) storage zone or layer 106a made of a suitable dielectric material such as silicon nitride ($Si_3N_4$) and an ultra-thin (i.e., about 30 Å) interfacial zone 106b of an anisotropic dielectric material such as silicon dioxide ($SiO_2$) at the underside of zone 106a. Zone 106b exhibits electrical insulating behavior that prevents penetration of thermally generated or even photogenerated charge carriers in modulator 104 to the undersurface of storage zone 106a; but zone 106b does allow tunnelling through to the storage zone 106a of photogenerated charge carriers under the influence of a suitable superimposed strong orthogonal electrical field through the tape layers 104a, 104b, 106b and 106a. In other words, charge carriers from the modulator 104 that have tunnelled through zone 106b under the influence of an applied field are "pinned" to the underside 106c of storage zone 106a in so-called charge centroids. In the absence of that field, zone 106b prevents additional carriers from reaching the storage zone and disturbing the properly accumulated charge count there. Thus, zone 106b traps all photogenerated positive carriers created during the exposure step in storage zone 106a, thereby storing an electronic signal pattern spatially in that zone of the tape and preventing also any lateral movements of said charge carriers in zone 106a so that an image having exceptional resolution is maintained for many years.

The tape 34 is very thin, being only a few microns thick, so that it is flexible enough to be wound easily onto reels 28 and 32. It may be made, for example, by the process described in applicant's copending patent application of even date herewith entitled Method and Apparatus For Making Inorganic Webs and Structures Formed Thereof, which disclosure is incorporated by reference herein. The imaging areas 34a of the tape have extraordinary properties, among which are extremely high sensitivity or photospeed, comparible to a silver halide film speed in the order of ASA 3,000. Each of these areas is imageable at low energy levels (e.g. 20 electrons minimum/pixel) due to low inherent noise (defects) and dark currents (threshold minimums). Thus, each of the areas has the capacity to acquire a very high quality electronic image corresponding to the optical image projected onto it by the microscope's lens unit 38. Furthermore, because of the barrier and trapping functions of the tape's unique dual-material storage layer 106, an image can be stored on the tape areas 34a for several years without any appreciable degradation of that image.

The images stored on the tape frames 34a can be read by scanning the surfaces 106d of those areas using the electron beam from gun 84 to produce exceptionally high quality displays or reproductions of the stored images. If desired, the image on each tape frame 34a can be erased by exposing the frame to ultraviolet light from a U.V. lamp 110 (FIG. 6) mounted in housing compartment 64 just above tape 34. This radiation discharges the frame's dielectric layer 106 enabling the film frame to be reused repeatedly and the frame area does not lose its optical signal acquisition and storage capabilities with such repeated usage.

The base or substrate 102 of tape 34 is quite transparent so that the segments of that substrate in the viewing frames 34b of the tape constitute windows. When one of these frames is located at the microscope's focal plane P, the operator sighting through eyepiece 68 can see right through that frame to the object being viewed, i.e., specimen S (FIG. 5).

In another application, as when the tape 34 is processed in a single lens reflex camera incorporating my invention, the surface of the substrate 102 may be abraded, etched or otherwise treated in the tape frames 34b so that it has the characteristics of frosted glass. If the modulator 104 and storage layer 106 are etched away to form the viewing frames, then only the clear sapphire substrate remains in the optical path for viewing the scenery as through a telescope; however, the refractive index of the substrate must be considered when the additional lens elements are calculated for the viewfinder subsystem. In any event, a virtual image of the scene in the camera's field of view will be projected onto the viewing frame located at the camera's focal plane and that image can be seen from behind the frame by looking through the camera's viewfinder eyepiece. It should be noted that the red, green, and blue filter lines, which represent the primary colors, will appear as white to the viewer (daylight spectrum). Also, of course, the phototape may consist entirely of imaging frames for use with an instrument having a seperate viewfinder.

Figure 2:
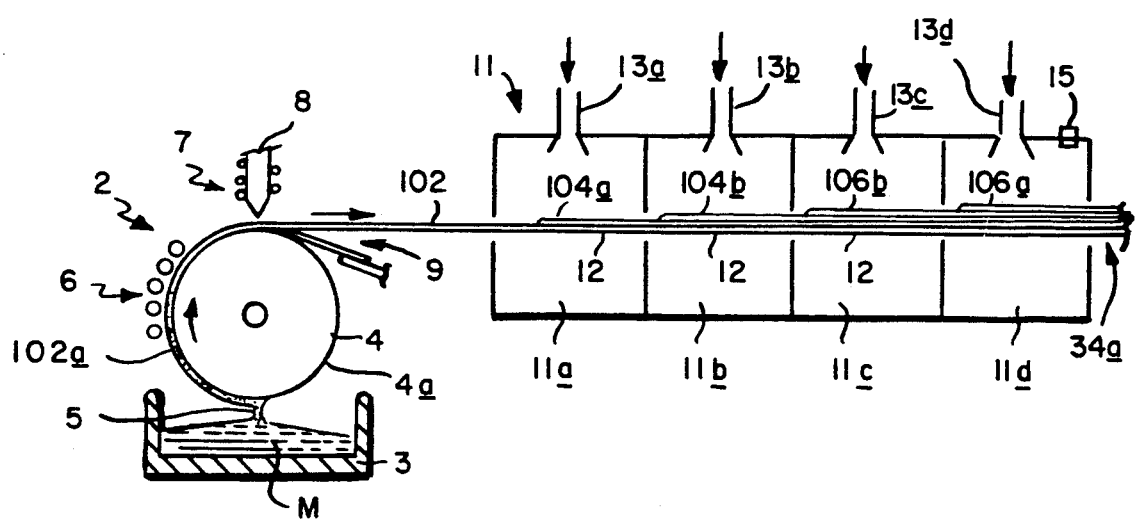
FIG. 2 is a diagrammatic view of apparatus for making the FIG. 1 medium so as to have a coherent crystal morphology.

Referring to FIG. 7, proper exposure of the imaging frames 34a of the tape requires that voltages from power supply 56 be applied to the conductive zone 104a at those frames. Accordingly, in the forward edge margin of each imaging area, the material zones 106a, 106b, and 104a to 104b are etched away so that a conductive strip 112 can be laid down on conductive zone 104a. If desired, in some applications the strip 112 adjacent each frame 34a may be isolated electrically from the similar strips associated with the other frames of tape 34 so that electrical connections may be made to each frame independently. As shown in FIGS. 6 and 7, when a particular imaging frame 34a is present at the microscope's focal plane P, a contact finger 118 at the front of compartment 64 contacts strip 112. As shown in FIGS. 2 and 4, that contact finger is connected in parallel to switches 122 and 124 in the microscope's control section 48. Alternatively, electrical connections to the strip may be made through the spool spindle 24 or 26.

As best seen in FIG. 6, an optical detector 134 connected to control section 48 is located at the righthand corner of compartment 64 above the tape. It is arranged to detect the transition from a transparent viewing frame 34b to the next opaque imaging frame 34a, i.e., the leading edge of an imaging frame. Whenever section 48 receives a detector 134 signal, it indicates that a viewing frame is positioned properly at focal plane P. That signal also indicates that the previous imaging frame 34a (or the tape leader) is located at the readout plane R in compartment 86 for a read operation on that frame by electron gun 84. A second similar optical detector 136 is positioned just above the tape on the righthand wall of compartment 86. Detector 136 emits a signal to section 48 whenever it detects the leading edge of a frame 34a, thus indicating that a frame 34a is positioned properly at focal plane P, ready for imaging. Thus, the detectors 134 and 136 together provide position signals to section 48 enabling that section to control servomotors 42 to position a tape frame 34a or 34b at either the exposure position at focal plane P or the scanning or readout position at readout plane R.

Figure 9:
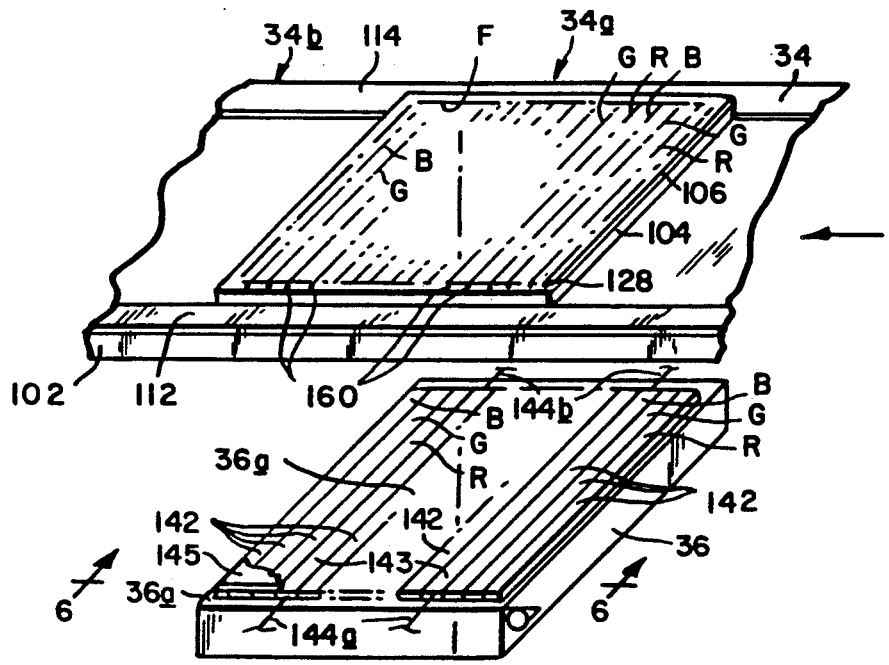
FIG. 9 is a view similar to FIG. 7 showing a portion of the FIGS. 5 and 6 system in greater detail.
Figure 10:
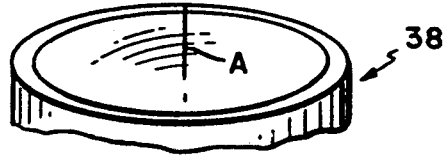
FIG. 10 is a side elevational view on a larger scale taken along line 10—10 of FIG. 9.

Refer now to FIGS. 9 and 10 of the drawings which depict the portions of microscope-camera 10 that set automatically the instrument's focus and its exposure in accordance with the prevailing lighting conditions. These parts include an array of numerous thin, parallel, transparent, abutting, bandwidth-limited, electrically insulating, color filter stripes 142 formed on the platen surface 36a that supports the tape 34 at the camera's focal plane P. The stripes extend longitudinally and parallel with respect to the tape edge so that they coincide with the scan line pattern associated with the electron beam from gun 84. Although the drawing figures illustrate stripes 142 as being relatively thick and few in number, in actuality there may be several thousand stripes in the array on platen 36, each stripe being in the order of only a few microns wide and a few microns thick.

The filter stripes 142 on platen 36 consist of very fine abutting parallel red (R), green (G), and blue (B) films which divide the incoming light image into its color components. Thus, when a tape frame 34a is exposed at plane P, the image applied to the frame consists of red, green and blue color components of the object being viewed which are interlaced on the frame as shown. In other words, the picture information for each color component of the picture is stored every third line on the tape frame. The color filter lines coincide with the raster path of the scanning electron beam from gun 84, when that imaging frame is located at read-out plane R in compartment 86. The width of the scanning electron beam may be slightly less than the width of the filter stripes to compensate for any residual skew and any minute misregistration of the tape frame 34a between its exposure position at plane P and its read-out at plane R.

Interspersed with the stripes 142 are a series of thin, photoconductive stripes 143 featuring large band width sensitivity. The function of stripes 143 is to detect incident light levels when their photo-currents are all integrated and image contrast (focus) when their differential photo-currents attain the widest amplitude spread. Suitable photoconductive materials for stripes 143 include silicon or gallium arsenide (GaAs). Electrical leads 144a and 144b lead from the conductive layers of each stripe 143 to the camera's control section 48. The number of photoconductive stripes 143 may be only 10 or 100 out of the several thousand filter stripes 142, placed at ninety line intervals, for example. When a voltage is applied across each stripe 143, the current through that stripe will provide a measure of the intensity of the light incident on that stripe. The photodetector stripes 143 are quite opaque as compared to the color filter stripes whose transparency exceeds 90% in the bandwidth limited region but since they are relatively few in number, they attenuate the incident light only minimally.

Preferably, a transparent conductive film or layer 145 overlies stripes 142 and 143, clearing the latter as shown in FIG. 10, to form an electrode which is connected by a lead 145a to control section 48. During the exposure process, control section 48 biases layer 145 negative with respect to the tape conductive layer so that that frame is electrostatically attracted to platen 36 and held closely to the filter stripes 142. On the other hand, when the tape is being moved before and after exposure, section 48 applies a DC voltage of the opposite polarity to layer 145 so that the tape is electrostatically repelled from the platen 36 to minimize scratching of the tape base 102.

When the operator depresses the EXPOSE button 52 (FIG. 5) to record an optical signal on a tape frame 34a just prior to exposure of that frame, control section 48 connects stripes 142 to the power supply 56 so that a constant voltage is applied in parallel across all of the photosensitive stripes 143. The control section then samples and integrates the currents through the stripes to develop a total flux (TF) signal which represents the total light flux incident on the tape frame 34a being exposed. That TF signal is then used by control section 48 to control the charging current flowing during the separately computed on-time of the electron source 74 during the exposure process; the control section also "finds" the stripe producing the smallest signal, representing the darkest part of the image, the magnitude of that signal, referred to herein as the exposure duration (ED) signal, being used by section 48 to control the "on time" of the electron source 74 during the exposure process, the mathematical product of current and "on time" being proportional to the incident light flux.

Figure 11:
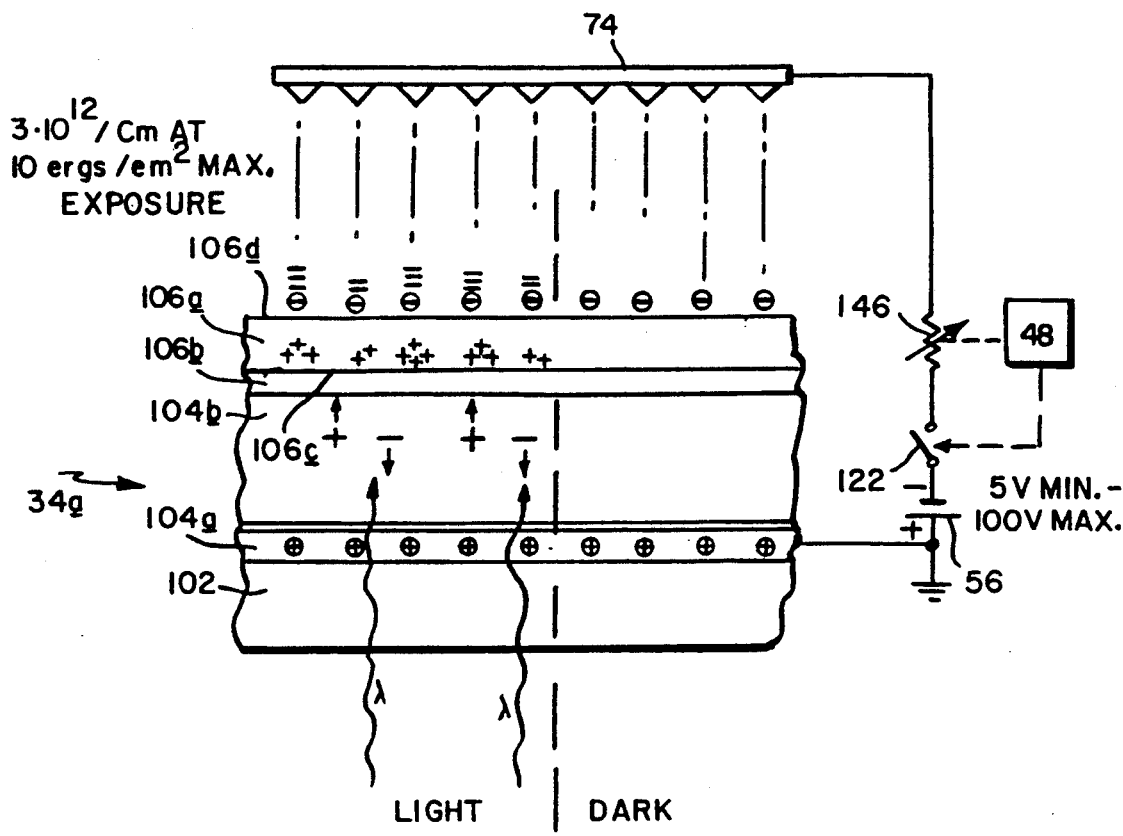
FIG. 11 is a diagrammatic view illustrating the exposure of the FIG. 7 medium.
Figure 12:
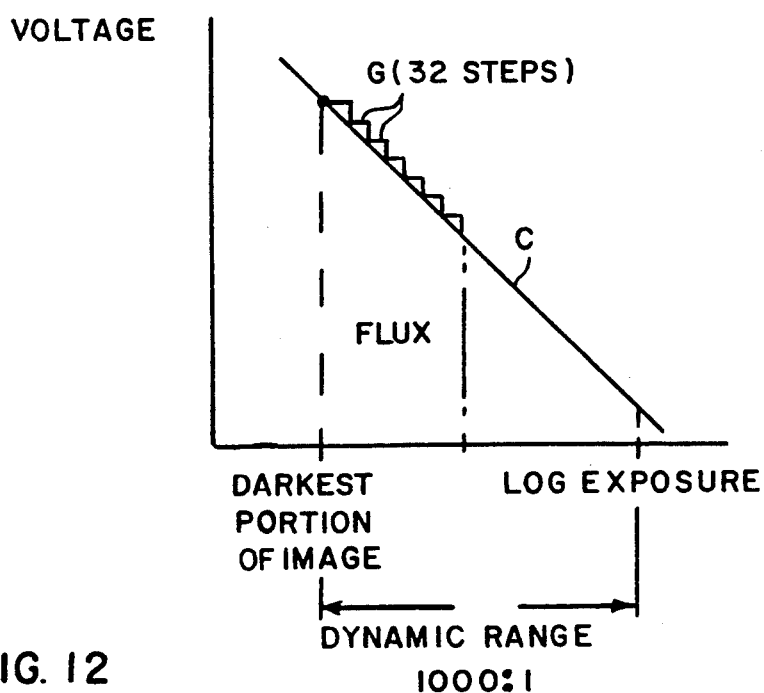
FIG. 12 is a graph showing the mode of controlling exposure.
Figure 13:
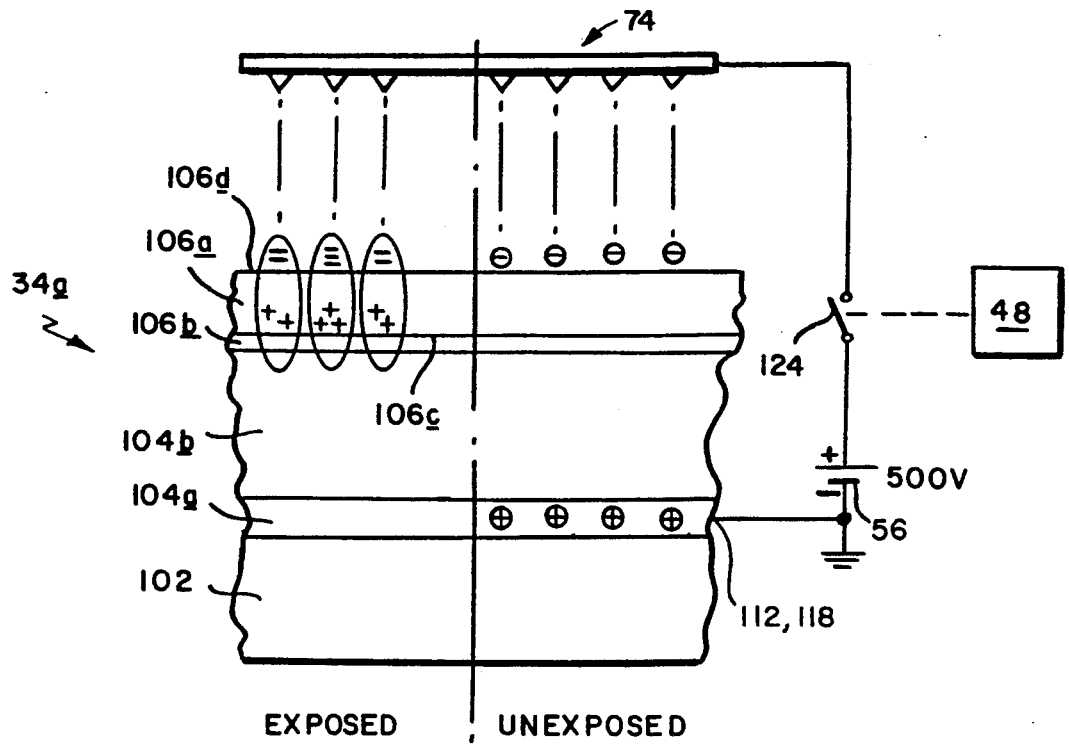
FIG. 13 is a view similar to FIG. 11 which helps to explain the removal of excess charge from the FIG. 7 medium.

Refer now to FIG. 11 which shows the electrical environment of the film frame 34a during exposure and FIG. 12 which depicts a typical characteristic curve C for the frame being exposed. Effectively, control section 48 controls a variable resistor 146 connected in series with electron source 74, a 5–100 volt tap of power supply 56, switch 122 and tape imaging frame 34a at layer 104a thereof so that the darkest part of the light image being projected onto the frame receives a selected minimum exposure, i.e., at least $10^9$ photons/cm$^2$ corresponding $10^{-3}$ ergs/cm$^2$. In a typical case, the charging current in the FIG. 11 circuit is under one ampere and persists for one microsecond to one second (or more), depending upon the amount of light incident on the tape. Each incident photon produces one electron-hole pair in modulator layer 104 as shown in FIG. 11. In the portions of modulator 104 where the light image is darkest, the incident photons emanating from a faint image typically produce in the order of $3 \cdot 10^8$ electrons/cm$^2$. For the brightest parts of the modulator, there may be in the order of $3 \cdot 10^{11}$ photogenerated electrons/cm$^2$. Thus, the charges stored at different locations on layer 106 may vary from, say, 20 electrons/pixel to $20 \cdot 10^3$ electrons/pixel. The difference yields a dynamic range of 1000:1, permitting the retrieval of far more than the desired thirty two different grey levels G in the image being recorded on the tape frame 34a, as shown in FIG. 12.

The electric field across the tape causes the photogenerated electrons to move toward conductive layers 104a from where they are conducted away to the ground plate of the battery 56 via conductive layer 104a. The photogenerated positive carriers or holes move toward tape storage layer 106. Under the influence of the strong superimposed external field extending between the electrode layer 104a and the virtual electrode formed by electron deposition on surface 106d and the additional internal field formed between negative electronic charges on the surface 106d of layer 106 and the innate positive potential of the holes, these holes tunnel through the interfacial zone 106b and are trapped in the undersurface 106c of the dielectric zone 106a in numbers that are in direct proportion to the image brightness in the different parts of the image area I of the frame 34a. These positive charges are balanced by equal numbers of electrons from source 74 that repose on the surface 106d of layer 106 as shown in FIG. 11. Although the charge domains or numbers of electrons stored at adjacent pixels on tape surface 106d may vary to establish the contrast or grey levels in the stored electronic images, the potential versus electrical ground is equalized throughout the frame area. Thus, during exposure, control section 48 charges frame 34a to a voltage and for a time so as to operate on the optimum segment of the tape's characteristic curve C (FIG. 8) under the prevailing lighting conditions. Accordingly, there is no possibility of over-exposure or under-exposure of the picture being taken by camera 10 and stored on each tape frame 34a in an exposure energy range from a minimun of $10^{-3}$ ergs/cm$^2$ to 10 ergs/cm$^2$.

As noted above, the photosensitive stripes are also used to focus the camera when a viewing frame 34b is located in the focal plane P. Accordingly, the specimen S (FIG. 6) will assuredly be in focus when seen through eyepiece 68 and frame 34b or when photographed on the next imaging frame of the tape. More particularly, when control section 48 receives a signal from detector 134 indicating that a viewing frame 34b is positioned at focal plane P, it provides a constant voltage across stripes 143 and samples the current signals from these stripes as described above. When an out-of-focus image is projected onto the array of stripes which, in fact, defines the camera's focal plane P, that image will be blurred and will have little or no gray level differentiation or contrast over the image area in plane P. Accordingly, the output signals from the array of stripes 143 will have a corresponding lack of differentiation. As the projected image at plane P is brought into focus, there is greater contrast between light and dark areas of the projected image. Ultimately, when the image projected onto the stripe array is in exact focus, the differences between the lighter and darker areas of the image will reach a maximum, as will the amplitude spread of the differential photo currents from the stripes 143 corresponding to those image areas.

During the focusing process, control section 48 repeatedly samples the set of signals produced by the stripe array. During each such sampling, after being digitized, the signals from the stripes are subtracted to develop a set of difference signals which are averaged and inverted to produce a feedback signal to control the motor 39 that moves lens unit 38. If, as a result of a given sampling, the motor 39 is driven to improve the focus, the feedback or difference signal resulting from the subsequent sampling of the stripe signals will reflect that fact and the driving of the motor 39 will continue until the feedback signal is reduced to zero. On the other hand, if there is no improvement in the focus after a few samplings and consequent lessening of the feedback signal, indicating that the lens unit 38 is being moved in the wrong direction to achieve focus, control section 48 will reverse the polarity of the voltage applied to motor 39 so that during subsequent samplings of the stripe 143 array, the resultant feedback signal will cause motor 39 to move unit 38 in the right direction to focus the microscope-camera 10.

The automatic focus procedure described above is initiated just prior to exposure by control section 48 following depression of EXPOSE button 52. It can also be initiated by depressing the FOCUS button 49 on housing 12 if a specimen is to be viewed without being recorded.

It is generally desirable to make the focusing stripes 143 wavy, instead of straight, as shown. This avoids periodicity problems that could occur if the object being focussed upon is composed of alternate light and dark bands extending parallel to straight stripes 143, e.g., a picket fence. Also, if the present invention is incorporated into a single lens reflex camera, the photosensitive stripes 143 need only be present in a small area at the center of the platen 36 which may be marked by a border. When taking a picture, the camera is aimed so as to center that border on the point of most interest in the field of view. In this way, the focus and exposure settings will be determined by the distance and lighting conditions at that location.

In describing the operation of microscope-camera 10, we will assume that the operator has pressed the FORWARD button 50 to advance the tape 34 while it is being repelled from platen 36 as discussed above until detector 134 signals the presence of the first viewing frame at focal plane P. Upon receipt of that detector signal, control section 48 stops drive motors 42 and closes the tape gate (if present) thereby locking the first viewing frame 36b at the focal plane P.

The control section also initiates the focus routine described above by sampling the signals from the array of stripes 143 on platen 36 until the instrument is brought into exact focus on the desired object in the field of view, i.e. specimen S. At this stage, the electron source 74 is in its retracted dotted line position in FIG. 6 so that the operator can examine specimen S by looking through the eyepiece 68. The instrument is also now ready to store a picture of specimen S on the first imaging frame 34a of the tape 34 if the operator wants to do this. In that event, he depresses the EXPOSE button 52 on the camera housing which prompts the control section 48 to issue a series of command signals that control the various operative parts of the camera. More particularly, section 48 energizes and samples the signals from stripes 143 to develop and store TF and ED signals as described above. From the TF signals, section 48 computes the adjustment for resistor 146 to bias the tape to establish the requisite exposure field strength in the tape for the exposure duration called for by the ED signal. In other words it customizes the charging and duration to the prevailing lighting conditions and the range of densities of the object being viewed. Then, section 48 applies a drive signal to motor 78 causing the motor to extend the electron source 74 to its solid line position in FIG. 6 wherein it overlies the focal plane P and blocks light entering the microscope through eyepiece 68. Section 48 also applies drive signals to servomotors 42 to advance the tape, which advancement continues until the leading edge of the first imaging frame 34a is detected by detector 136.

Control section 48 responds to the detection signal from detector 136 by deenergizing motors 42 to stop the tape advance and by closing the tape gate (if present). That section also charges film layer 145 on plate 36 so that the imaging frame 34a is now positioned at focal plane P and held against the platen 36. That detector signal also prompts control section 48 to advance the frame counter 55 so that it shows the numeral "1". After section 48 receives acknowledgements indicating that all of the above operations have been completed, it energizes electron source 74 with power from power supply 56, adjusts resistor 146 (FIG. 11) and closes switch 122 for the duration of the ED signal thereby grounding by way of contact 118 and strip 112 the conductive layer 104a of the tape frame at plane P. This applies at the beginning of the exposure no less than 5 volts across the frame to facilitate tunnelling of photogenerated charges through zone 106b. It also causes a cloud of electrons to descend toward, and uniformly charge, the exposed upper surface 106d of the film frame at plane P, while at the same time that frame receives imaging photons through the lens unit 38. Resultantly, as described above in connection with FIGS. 11 and 12, a strong electric field is developed in zone 106b so that positive carriers tunnel through that zone and become pinned or trapped in zone 106a, approximately 100 Å into that zone. Further, controlled by the value of the TF signal, source 74 disperses a specific amount of negative charges during the exposure duration to equal the maximum number of photogenerated charges which have tunnelled through zone 106b, thereby establishing a charge equilibrium in the storage zone 106a. Accordingly, a perfectly exposed electronic equivalent image corresponding to the photonic image projected onto focal plane P is acquired by that tape frame and stored in its storage layer 106.

As described above, the electronic image is present on layer 106 as a topographical distribution of different-charge coulombic domains over the area I of the tape frame 34a. This distribution is composed of two parts, namely the charges which were deposited on layer 106 at the beginning of the exposure step to establish the initial internal field between the surface 106d of layer 106 and electrode layer 104a, plus the photogenerated charges created by exposure of the tape frame. Thus, the number of electrons at each point on the surface 106d equals the number deposited initially (circled in FIG. 11) plus a number of electrons corresponding to the number of photogenerated positive charge carriers that tunnelled through zone 106b during the exposure step (uncircled in FIG. 11). In the normal mode of operation, the initial charge (circled in FIG. 11) remains on the tape frame 34a after the exposure step is completed, i.e., after electron source 74 is shut off and switch 122 is opened. Thus, the charges on zone 106a are spatially varied by the number of photogenerated carriers which became superimposed on the evenly distributed carriers present in thermal equilibrium initially. However, at each point on the frame 34a, the numbers of opposed positive and negative charges are substantially equal.

After the exposure step, when source 74 is turned off and switch 122 is open, thereby removing the negative bias that was set to control electron cloud current density and duration, the positive charges which tunnelled through zone 106b are pinned in place in zone 106a, the retention time ($t_r$) being determined by the decay of the space charge layer near the interface layer 106b, as follows:

$$t_r \approx \ln 2 / [\nu \exp(g\phi_B/kT)]$$

where $\nu$ is the dielectric relaxation frequency.

It should be noted that any free thermally generated or even photogenerated positive carriers now have insufficient energy (kT/q=26 MeV) to tunnel through the zone 106b barrier ($g\phi_B$=1.7V) and upset the stored charge count at the underside 106c of zone 106a. If there are still any excess negative charges on the surface 106d of zone 106a, i.e., electrons with no opposed positive carriers at the underside of zone 106a, these may be removed by means of a grounded conductive roller 160' (FIG. 6) rotatively mounted in the bottom wall of camera compartment and touching the surface of zone 106a as the tape is advanced automatically to its next frame position. It should be noted that those electrons representing the image remain unaffected as the conductive roller passes over frame 34a.

Simultaneous with the recording of the picture on each tape frame as just described, an electronic fiducial mark 128 is recorded in the top (i.e. right hand) edge margin of that frame outside the image area I thereof as shown in FIG. 7. As will be described later, these marks 128, recorded at the same times as the images, enable the microscope-camera 10 prior to each read-out operation, to set the initial position (zero) and skew of the scanning beam from electron gun 84 to compensate for any slight mispositioning of each tape frame 34a at its position at plane R when an image is read from the frame with respect to its position at plane P when that image was recorded on that frame. Microscope-camera 10 records these marks 128 on the tape by means of a light unit 132 located in platen 36 at the righthand corner of compartment 64 at focal plane P.

Figure 7A:
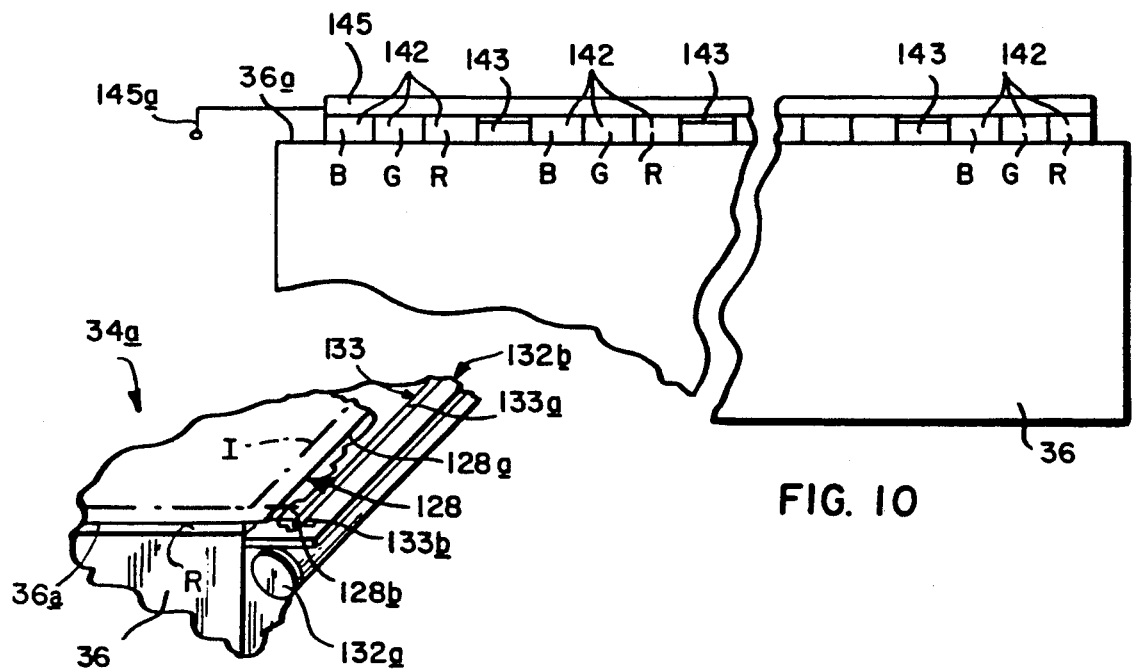
FIG. 7A is a similar view showing a portion of the FIG. 5 instrument in greater detail.

As best seen in FIG. 7A, unit 132 comprises an elongated light source 132a such as a LED or laser diode extending transverse to the tape 34 and which preferably emits green (e.g. λ=500nm) light. The other component of unit 132 an opaque mask 132b positioned to be in intimate contact with the tape in plane P. The mask has a precise narrow (e.g. 1 micrometer) elongated (e.g. 10 mm) slit leg 133a extending transverse to the tape (i.e. X axis) with a (Y axis) cross-slit 133b adjacent the forward edge of platen 36. Each time an optical image is impressed on the image area I of a tape frame 34a, control section 48 energizes light source 132a so that the marginal area of tape frame 32a opposite slits 133a and 133b receives a saturating dose of light.

Figure 14:
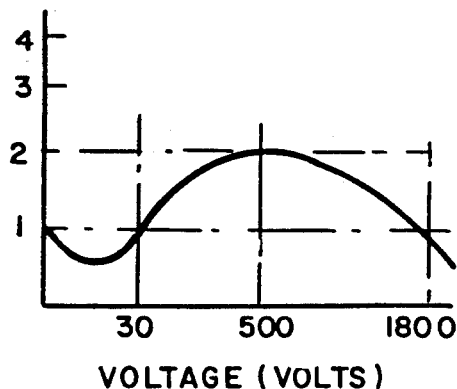
FIG. 14 is a graphical diagram that also helps to explain that step.
Figure 15:
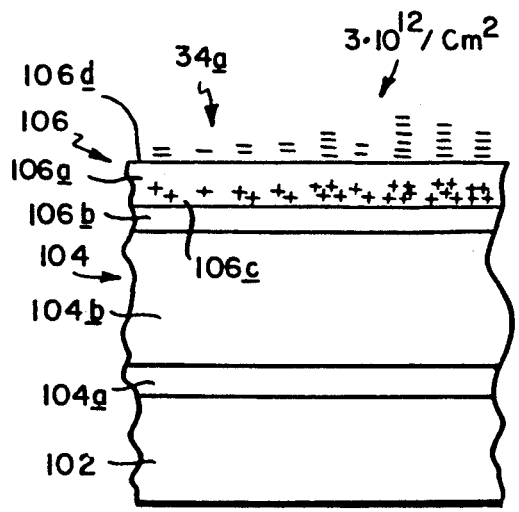
FIG. 15 is a view similar to FIGS. 11 and 13 showing the electronic image stored on the FIG. 7 medium.

As shown in FIG. 14, at that applied voltage, the number of secondary electrons emitted from zone 106a exceeds the number of arriving primary electrons from source 74. Once the electrons are removed from the darkest parts of the image areas (i.e., those circled electrons deposited initially at the beginning of the exposure step), only the uncircled electrons remain which counterbalance the positive charges pinned to the underside of zone 106a. Thus, as shown in FIG. 15, only the charges corresponding to the image remain on the frame. In response to incident light varying from 6·10 photons/cm$^2$ to 6·10$^9$ photons/cm$^2$, a typical electronic image as in FIG. 15 might vary from 20 electrons/pixel to 20,000 electrons/pixel, corresponding to a field strength of 70 V/cm to 70·10$^3$ V/cm inside the storage zone 106a. The net result is that in the unexposed or dark portions of the frame, the originally applied 3·10$^{11}$ electron/cm$^2$ blanket charge is removed so that the stored image is completely free of this bias. The surface charge in the exposed portions of the frame also drops to the exact same extent, but now reflects only the image information.

The magnitude of the dark current in modulator 104 during exposure and bias removal is temperature dependent and relatively small in comparison to the charges created during exposure. second picture which will then be stored on the second imaging frame 34a of the tape with the frame counter 55 being incremented to show a "2". In a similar manner, electronic images can be recorded in sequence on the remaining imaging frames 34a of the tape by repeatedly pressing EXPOSE button 52. After each such exposure, the next viewing frame 34b is moved to the focal plane P and the frame counter 55 will have been incremented by one. The tape 34 has typically several hundred or more sets of viewing and imaging frames so that a large number of images can be stored on a single tape.

Also, if the operator wishes, he may skip frames if he chooses to do so. For this, he presses the FORWARD button 50 repeatedly causing control section 48 to actuate drive motors 42 to repeatedly step the tape to place succeeding viewing frames 34b at plane P and to increment the counter 55 until the counter displays the desired frame number. The operator can now view beforehand, and then take a picture of, a new specimen may be deposited on the next imaging frame 34a. The skipped frames can then be returned to and used later by depressing the REVERSE button 51. This causes control section 48 to actuate the drive motors 42 to step the tape backwards and to decrement counter 55 until the desired frame number is displayed by the counter, one may tape forward or in reverse without exposing the tape by depressing button 50 or 51. As each frame 34a moves past detector 136, the resultant detector signal causes control section 48 to increment or decrement the frame counter 55. When the selected frame number is displayed by the frame counter, the imaging frame 34a corresponding to that number is positioned at the focal plane P. The operator may then depress the READ button 53 which will cause control section 48 to advance the tape one frame to place that selected frame at the readout plane R in the darkness of compartment 86. Then section 48 automatically executes a read-out routine. Further, it first energizes the electron gun 84 and its beam control circuit 88 in housing compartment 92 from power supply 56 or from a remote power source via connector 62 (FIG. 5). Then, as best seen in FIGS. 6-8, it closes a switch 157 which connects a contact 158 in compartment 86 (and thus film layer 104a) in a high voltage DC circuit with gun 84 and power supply 56. In this circuit, the gun cathode receives a voltage of about −2KV, while collector 94 is at ground potential and film layer 104b is held at a bias voltage of about 300V. Resultantly, as shown in FIG. 6, electron gun 84, and more particularly its emission electrode 84a, locates in an enclosure 84b, emits a small diameter (i.e., 2 micrometer) electron beam which impinges the selected imaging frame 34a at read plane R. Cold cathode electron emission sources 84 which can be operated with very little power (about 1 nonoampere) are known in the art.

As best seen in FIG. 6, on its way to the tape frame at read-out plane R, the focused electron beam e from electrode 84a passes between the vertical and horizontal deflection plates 84c and 84d of gun 84. Normally, a controlled voltage is applied to each set of plates by the beam control circuit 88 so as to cause the electron beam e to sweep out a raster composed of parallel scan lines L (FIG. 7) on the imaging frame 34a positioned at plane R, penetrating that frame's layer 106 to an exactly known depth. Where the beam impinges the frame, secondary electrons are emitted from layer 106a at that point. The electron beam operates at the so-called second crossover point so that each primary electron results in the emission of one secondary electron from layer 106. These secondary electrons form a return beam e' which is modulated by the number of charges representing the electronic image stored on surface 106d with its counter-charges at the underside 106c of that frame 34a. In other words, the numbers of secondary electrons emitted at each point on frame 34a impinged by the primary electron beam will depend upon the number of charges and counter-charges stored at that point on layer 106. More specifically, where the number of stored electronic charges on layer 106 is larger, corresponding to a fiducial mark 128 or the lighter areas of the acquired optical image, there will be fewer electrons needed in the primary beam to achieve the signal level carried in the secondary emission e'. There is likewise an increase in the number of primary electrons in the scanning beam from a point on the swept frame area where there are fewer stored charges, corresponding to a darker area of the stored image.

The secondary electrons comprising the return beam e' strike collector 94. Readout by secondary electron emission allows the employment in the collector of an optimum performance, low noise amplifier such as a dynode amplifier. This is a known electronic device consisting of a succession of electron emitters arranged so that the secondary electrons produced at one emitter are focused upon the next emitter. This amplifier thus produces a current output which is as much as one million times stronger as the input represented by return beam e' and thus it also represents the amplified version of the mark 128 and the electronic image stored on the tape frame 34a.

For each frame 34a, the amplified signal from collector 94 includes a very strong component corresponding to the fiducial mark 128 recorded on the margin of that frame and a component corresponding to the electronic image recorded in that frame's image area I. The former component is separated out, say, by threshold detection, and routed to control section 48 where it is used to initialize the beam scan from gun 84 so that the beam scan is always made with reference to the images on the tape rather than to the tape itself. In this way, a slight mispositioning or skewing of the tape in its movement from plane P to plane R will not affect the readout process.

More particularly, at the outset of each read-out operation, control section 48 causes beam control circuit 88 to execute a search routine whereby that circuit moves the beam e in the X and Y directions over the margin of tape frame 34a until the collector 94 detects strong bursts of secondary electrons at the intersection of the crossarms 128a and 128b which constitutes the reference position of the beam scan. Circuit 88 then causes the primary beam e to track along the X axis arm 128a of the mark which is inherently parallel to the filter stripes 142 through which the image on that frame was exposed. This ensures that when the beam e sweeps over the image area I during read-out, the beam scan lines will be parallel to those frame exposure lines. The circuit 88 then starts the beam scan at the corner of image area I closest to the mark 128 which is offset a constant distance from the aforesaid zero position, i.e., the "electronic cross-hairs" 128a and 128b.

During the scan of image area I, the picture signal component from collector 94 is applied to an A/D converter included in read-out circuit 96 in housing compartment 98 and is otherwise processed by circuit 96 to provide a picture signal. When a color image is being read from a frame 34a, control circuit 88 controls the electron gun 84 so that the electron beam e scans the electronic image on frame 34a in three successive operations. First the beam scans the frame where it was exposed through all of the red filter lines (R); then it scans the frame lines that were exposed through the green filter lines (G), and finally it scans the portions of the frame area that were exposed through the blue filter lines (B). The three successive scans produce a set of red, green and blue picture signals corresponding to the image on that frame. These signals are digitized and, after being color corrected in circuit 96, they may be applied to terminal 20 (FIG. 5) to print or display color pictures corresponding to the images stored on tape 34. Alternatively, if separate long-term storage of the picture signals read from the tape frame is required, the signals may be applied via connector 21a to a conventional video disc or video tape drive.

The initial zeroing of the electron beam e that scans the tape frame to be read at plane R using the electron fiducial mark 128 recorded along with that image assures that the scanning electron beam e will sweep across the tape frame in register with the lines on that frame that were exposed through the color filter stripes 142 when the tape frame was at plane P. If desired, however, additional beam control may be obtained by recording tiny fiducial marks 160 (FIG. 9) on a non-imaged side margin of the tape frame which are congruent with each red, green and blue filter stripe 142 when the frame 34a is positioned at focal plane P. In this event, the read-out circuit 96 would include a discriminator to separate the color picture signals read from the image area I of film frame 34a and the scan line position signals read from that frame outside the area I. The latter signals are then processed by electron gun control circuit 88 to control, in a correctional feedback arrangement, the deflection voltages applied to the electron gun's deflection plates 84c and 84d to correct for any misregistration of the scanning beam e with the frame lines corresponding to the color filter stripes 142.

The detection threshold of collector 94, i.e. its sensitivity, is such that each individual secondary electron can be detected and amplified so that the amplification factor of the resultant signal from collector 94 can be as high as $10^6$ or more. Thus, the read-out process carried out by instrument 10 involving detection of secondary electrons emitted from tape 34 is totally different from the prior scanning methods described at the outset which detect a capacitively modulated current signal from a recording medium. By detecting and simply counting individual electrons in a return beam instituted by the charge distribution on tape surface 106d of frame 34a, rather than current flow through the frame, the present apparatus can take advantage of the highly sensitive defect-free nature of the tape frame 34a, to produce a picture signal which has extremely high resolution and information content. Furthermore, it can accomplish this at a lower read-out or scanning voltage, thereby conserving battery power.

In some applications, the scan control circuit 88 can be arranged to control the beam from gun 84 so that it scans two different rasters. A rough scan, say, every other or every third color line, may be executed for each color to provide picture signals suitable for previewing on terminal 20 to see if the correct image is being readout. Then, if the image is correct, a regular scan at the finer resolution may be performed to reproduce a hard copy of that image.

In a preferred embodiment of my system, means are provided for increasing the beam current in the beam e from gun 84 while that beam dwells at each picture element or pixel in its scan across frame 34a so as to extend the dynamic range of the system's charge detection capabilities. This is desirable if more charges per pixel are present on the tape frame than can be handled by the usual lower beam current. More particularly, the read-out circuit includes a threshold detector which counts the number of secondary electrons emitted from each pixel over a time period equivalent to a fraction, e.g. one-half, of the dwell time of the beam at that pixel. If the threshold is exceeded, the detector issues a signal to control section 48 causing that section to double the current in the beam from gun 84 for the remainder of the dwell time at that pixel. Such doubling will thereupon increase the dynamic range of the system by a factor of 10 to ensure that it will not be saturated or overloaded by especially strong image signals on the tape.

Unlike prior systems, when instrument 10 scans a frame 34a during read-out, it does not destroy the electronic image stored on that frame. On the contrary, it automatically refreshes that image which can thus be read over and over again. This is because during scanning, which takes place in the darkness of compartment 86, there are no photo-induced electron-hole pairs produced in the medium's modulator 104; nor is there any buildup of charge on the medium's layer 106 since the beam operates, by choice, at the second crossover point as mentioned above. Resultantly, the positions of the positive charge carriers (holes) at the underside 106c of storage zone 106a remains undisturbed, while the negative charges at the surface 106d of that layer are continually replenished by electrons in the electron beam to maintain a charge balance across the layer 106 at each point thereon as depicted in FIG. 15. As a consequence, the field strengths of the charge domains distributed on layer 106 of each frame 34a are maintained, allowing theoretically infinitely repeated read-outs of that frame.

Indeed, the electronic images stored on unread frames 34a can be refreshed or renewed from time to time by repositioning each such frame at focal plane P and flooding it again with electrons from electron source 74 with the switch 122 (FIG. 8) remaining open so that that frame's conductive layer 104a is not grounded. Those beam electrons will replace any electrons on the outer surface 106d of storage layer zone 106a that may have leaked away over time so that the negative charge distribution on that surface will again correspond to the distribution of positive carriers still present at the undersurface 106c of that zone.

Instead of retrieving the image stored on the tape 34a by electron beam scanning as shown, the tape can also be read by detecting so-called "tunnel electrons" using a sensing needle that is caused to scan across the surface 106d of tape layer 106. As the needle moves across that surface, an electron cloud is present in the gap between that surface and the needle tip as a consequence of the stored electrons' wave-like properties. Resultantly, there is a voltage-induced flow of electrons through the cloud which varies from point to point on the tape, depending on the charge stored thereat. This electron tunnelling and detection phenomenon is described in greater detail in *Scientific American*, August 1985, pp. 50-56. Using this technique, electrons can be "picked off" the frame surface 106d at each point on the frame to produce picture signals corresponding to the image recorded on the frame.

Microscope-camera 10 with its recording medium can be used in a variety of ways. It can be used for long or short term data storage, as described above. It can also be used for buffer storage or to effect comparisons between the same optical image recorded at different times. For example, a picture of specimen S recorded on one tape frame 34a can be read-out to one channel of a terminal 20 with a two channel capability. Then, the same specimen can be recorded at a later time on another tape frame 34a and immediately read-out to the other channel of terminal 20 so that the two pictures of specimen S can be displayed side by side. The output signals, also produced by instrument 10 during a read-out operation, can be processed digitally using means well known in the color graphics industry to produce an enlargement of the stored image or any selected area thereof or to generate pseudocolor and false color variations of the stored image. In addition, as alluded to above, the present invention can be incorporated into a single lens reflex camera. In this event, the electron gun 84 would be located in the same compartment as the instrument's primary lenses. In other words, the focal plane P and the read-out plane R would be the same. The camera's viewing optics, on the other hand, would be located in a compartment branching from the main compartment 64 with appropriate mirrors and lenses to permit the operator to look through the camera eyepiece to the back of a film frame 34b positioned at the camera's focal plane. Also, an appropriate shutter would be provided to isolate that branch compartment while the aforesaid exposing and read-out processes are carried out in the camera. Also, in such a camera, the filter stripes 142 (R, G, B) can be applied to the exposed surface of the film substrate 102 rather than to platen 36, as described above, to simplify registration of the scanning beam with the filter lines during read-out.

It is important to understand that the reading out of the electronic image stored on the medium 34a by the detection of secondary electrons is quite unlike the scanning processes used in the prior systems discussed at the outset which develop a capacitively modulated current signal. This readout technique disclosed here is made possible only with the development of the unique recording medium 34a described herein. This is because only this medium achieves the crystalline perfection in its various layers that enables the storage of the electronic image as precisely distributed minute charge domains on layer 106 as described above. Using a finely focussed scanning electron beam, these minute charges produce the requisite high energy but low voltage modulation of the numbers of secondary electrons emitted from successive points in the beam scan to produce a picture signal with an information content comparable to that in the stored image. Furthermore, this can be accomplished using a relatively low voltage battery supply. Therefore, the medium of this invention is particularly suitable for incorporation into portable recording apparatus such as a microscope or camera.

Thus, medium 34a meets completely the objectives set forth at the outset, namely, it obtains the benefits of both direct and indirect recording. More particularly, it acquires and stores the incoming light image in an analog form that retains all of the information in the incoming light wavefront and achieves maximum conversion of that incoming light energy to the electronic imagerepresenting charge pattern stored in the medium. Yet, the medium permits retrieval of that stored information as a serial electrical signal that can be stored or handled with the same ease as the signals in present day audio and video read/write systems.

In my medium, the silicon modulator 104 is typically grown to a thickness slightly in excess of one micron, thus allowing for the panchromatic or total absorption of incoming light over the entire wavelength range from ultraviolet to infrared. Also, the photoconductive properties of the silicon-based modulator allow for or provide an efficient response to incident light in this range. Indeed, fewer than six photons incident on the medium suffice to initiate a photoconductive reaction in modulator 104 and the quantum conversion efficiency of the medium approaches 100% as noted above. Furthermore, its purity, perfection and freedom from electrical noise combine to give the medium an exceptionally high signal-to-noise ratio, yielding a grey scale of over three decades in three colors. In fact, the medium is sensitive enough to acquire and store optical images in black and white or in color even under moonlight conditions and its response is comparable to that of photographic film having an ASA rating of 1000 or more. Furthermore, my medium suffers minimal hysteresis loss and fatigue when the image is erased from the medium by U.V. light as aforesaid. Therefore, it can be reused repeatedly without any appreciable loss of sensitivity or responsiveness.

Because of its many attributes described above, the medium disclosed herein should find wide application not only in image recording systems, including microscopes and cameras, but also in a variety of other areas, such as fiberoptic signal receiving systems, large bandwidth digital recording systems and optoelectronic switches.

It will thus be seen that the objects set forth above, amoung those made apparent from the preceeding description, are efficiently attained. Also, certain changes may be made in the above construction and in the method set forth without departing from the scope of the invention. For example, gallium arsenide may be used as the photoconductive material in modulator 104 relying on the "direct band gap" absorption properties of that material. Or, if sensitivity of the medium 34a to long wave radiation is of importance, the light modulating layer 104 may be composed of cadmium mercury telluride.

It should be appreciated from the foregoing also that my invention can be implemented as a recording medium which records and stores directly incoming electrical signals. For this application, first a conductive layer 104a and then a dielectric storage layer 106 are deposited on base 102. Electrical signals may be recorded on the medium by "writing" on the surface of zone 106a using a point source of electrons connected in a D.C. circuit with the conductive layer 104a. This produces a charge distribution on the storage zone similar to the charge pattern on layer 106a in FIG. 14 described above. Therefore, it is intended that all matter contained in the above description or shown in the accompanying drawings, shall be interpreted as illustrative and not in a limiting sense.

It will also be understood that the following claims are intended to cover all of the generic and specific features of the invention herein described.

What is claimed as new and desired to be secured by Letters Patent of the United States is:

1. In a plural layer optoelectronic recording medium in sheet or strip form of the type including a base layer having a surface and a light modulating layer added to said surface of the base layer the improvement wherein the base layer is a thin monocrystal of an inorganic material and whose crystal orientation and surface perfection are such as to enable the growth on said surface of a thin light modulating layer composed of an inorganic crystalline material with a very high degree of perfection from nucleation sites on said surface so that the entire medium has a coherent crystal morphology.

2. The medium defined in claim 1 wherein said medium also includes a thin dual-material dielectric storage layer added on top of said modulating layer and whose atomic lattice arrangement is compatible with those of said other medium layers and which stores a light image focussed onto it as a distribution of coulombic charge domains has anisotropic electrical properties regarding mobility of charge carriers in the storage layer.

3. The medium defined in claim 2 wherein said storage layer includes and interfacial zone adjacent to said modulating layer for inhibiting movements of charge carriers.

4. The medium defined in claim 1 wherein said modulating layer includes at least one electrically conductive zone adjacent to said base layer to form an electrode.

5. The medium defined in claim 1 wherein said base layer is transparent to light energy from ultraviolet to far infrared and the modulating layer is absorbtive to light over that same energy spectrum.

6. The medium defined in claim 1 wherein said base layer consists of monocrystalline sapphire.

7. The medium defined in claim 1 wherein said medium is highly flexible and spoolable.

8. A plural layer optoelectronic recording medium in sheet or strip form comprising
   A. a thin base layer consisting of a single web-like monocrystalline sapphire crystal whose surfaces are substantially defect free and having a surface;
   B. a thinner inorganic conductive layer grown as a crystal on said surface of the base layer from nucleation sites on said surface so that the conductive layer has a crystal arrangement that is compatible with that of said base layer and has a high degree of perfection;
   C. a thin photoconductive layer added as a continuum on top of said conductive layer and being capable of electrically modulating an incident light image; and
   D. a thin dual-material storage layer added integrally on top of said photoconductive layer for capturing electronic charge carriers from said photoconductive layer and thereby storing an electrical analog of said incident light image.

9. The medium defined in claim 8 wherein said base layer and conductive layer are transparent to light energy and the photoconductive layer absorbs incident light energy.

10. The medium defined in claim 9 wherein said medium is very flexible and spoolable.

11. The medium defined in claim 9 wherein all of said layers in the medium have compatible atomic lattice thereby forming a coherent hetero-epitaxially grown structure.

12. An optoelectronic recording tape comprising
   A. a thin, flexible, optically clear substrate;
   B. a conductive layer covering the substrate and for connection electrically to voltage applying means;
   C. a photoconductive layer covering the conductive layer; and
   D. a dual-material dielectric storage layer covering the photoconductive layer, said storage layer including
      (1) an interfacial zone covering the photoconductive layer, and
      (2) a storage zone for exposure to an electron cloud, said interfacial zone permitting the tunnelling through it of photogenerated charges from the photoconductive layer during exposure of the tape under the influence of a strong electrical field resulting from the deposition of electrons from electron generating means on the surface of the storage zone and the application of voltage to the conductive layer whereby said charges are trapped at anisotropic storage positions in the undersurface of said storage zone.

13. An optoelectronic recording tape as defined in claim 12 wherein said interfacial zone also inhibits electrical charges generated in said photoconductive layer after tape exposure when an electric field is not present from reaching said storage zone and upsetting the count of photogenerated charges trapped thereat during exposure of the tape.

14. The method of making an optoelectronic recording medium comprising the steps of
   A. forming a monocrystalline substrate layer as a very thin sheet or tape with a minimum number of internal lattice defects and with a high degree of surface perfection;
   B. growing a monocrystalline conductive layer or zone on a surface of said substrate layer from nucleation sites on said surface so as to continue the atomic spacing and internal perfection of the substrate layer; and
   C. growing a monocrystalline photoconductive light modulating layer or zone on said conductive layer so as to propagate the lattice arrangement and internal perfection of said conductive layer or zone thereby forming a hetero-epitaxially grown sheet or tape structure which is coherent with respect to its crystal morphology, but is layered or stratified with respect to its electrical and chemical characteristics.

15. The method defined in claim 14 and including the additional step of adding a dual-material dielectric storage layer to the exposed surface of the photoconductive layer so that the storage layer has an internal structure that is compatible with the photoconductive layer crystal lattice.

16. The method defined in claim 15 wherein the dual-material storage layer is added with a sufficiently high degree of perfection that it is chargable electrically with exceptional uniformity.

17. The method defined in claim 15 wherein the thicknesses of said layers are controlled so that one of said dielectric layer and said substrate layer is transparent and said medium is flexible enough to be rolled up into a small diameter roll.

18. The method defined in claim 15 wherein each successive layer added to the substrate layer is deposited at a temperature lower than the one needed to produce the previous layer and all deposition temperatures are sufficiently low as not to melt or otherwise disturb the substrate layer.

19. The method defined in claim 14 wherein the thicknesses of the substrate layer and conductive layer are controlled so that those layers are transparent to light energy over a wide spectral range.

* * * * *